United States Patent
Srinivasan et al.

(10) Patent No.: US 6,381,673 B1
(45) Date of Patent: Apr. 30, 2002

(54) METHOD AND APPARATUS FOR PERFORMING A READ NEXT HIGHEST PRIORITY MATCH INSTRUCTION IN A CONTENT ADDRESSABLE MEMORY DEVICE

(75) Inventors: Varadarajan Srinivasan, Los Altos Hills; Bindiganavale S. Nataraj, Cupertino; Sandeep Khanna, Santa Clara, all of CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/111,364

(22) Filed: Jul. 6, 1998

(51) Int. Cl.$^7$ .............................................. G06F 12/00
(52) U.S. Cl. ...................................... 711/108; 365/49
(58) Field of Search .......................... 711/108; 380/9, 380/50; 365/49

(56) References Cited

U.S. PATENT DOCUMENTS

| | | | |
|---|---|---|---|
| 3,257,646 A | 6/1966 | Roth | 340/172.5 |
| 3,353,159 A | 11/1967 | Lee, III | 340/172.5 |

(List continued on next page.)

FOREIGN PATENT DOCUMENTS

| | | |
|---|---|---|
| EP | 0 660 332 A | 12/1993 |
| JP | 08167295 | 6/1996 |

OTHER PUBLICATIONS

Masao Akata, "A Scheduling Content–Addressable Memory for ATM Space–Division Switch Control", IEEE International Solid State Circuits Conference, Feb. 1991, New York.

Ghose et al., "Response Pipelined CAM Chips: The First Generation and Beyond", $7^{th}$ International conference on VLSI Design, Jan. 1994, pp. 365–368.

Takeshi Ogura, et al., "A 4–kbit Associative Memory LSI", IEEE Journal of Solid–State Circuits, vol. SC–20, No. 6, Dec. 1985, pp. 1277–1281.

Simon R. Jones, et al., "A 9–kbit Associative Memory for High–Speed Parallel Processing Applications", IEEE Journal of Solid–State Circuits, vol. 23, No. 2, Apr. 1988, pp. 543–548.

(List continued on next page.)

*Primary Examiner*—Do Hyun Yoo
*Assistant Examiner*—Nasser Moazzami
(74) *Attorney, Agent, or Firm*—Blakely, Sokoloff, Taylor & Zafman LLP

(57) ABSTRACT

A content address memory (CAM) device that implements a read next highest priority or "RNHPM" instruction. The CAM device initially searches its CAM locations for a match with comparand data. If multiple matches are identified, then the CAM device initially outputs the highest priority matching address. The CAM device may output the highest priority matching address in the same system or a later clock cycle in which the compare instruction was provided. The CAM device may also output data stored in one or more of the CAM cells located at the highest priority matching location and/or status information including the match flags, a full flag, validity bits (e.g., skip and empty bits), and other status information. An RNHPM instruction may then be provided to the CAM device in the next clock cycle or a later clock cycle and cause the next highest priority matching address to be output by the CAM device. The next highest priority matching address may be output in the same or subsequent cycle as the RNHPM instruction and may also cause the CAM device to output data stored in one or more of the CAM cells located at the next highest priority matching location and/or status information for that location. RNHPM instructions can continue, to be supplied to the CAM device until no further matching locations are detected.

37 Claims, 18 Drawing Sheets

U.S. PATENT DOCUMENTS

| | | | |
|---|---|---|---|
| 3,602,899 A | 8/1971 | Lindquist et al. | 340/172.5 |
| 3,675,211 A | 7/1972 | Raviv | 340/172.5 |
| 3,685,020 A | 8/1972 | Meade | 340/172.5 |
| 3,868,642 A | 2/1975 | Sachs | 340/172.5 |
| 4,112,502 A | 9/1978 | Scheuneman | 364/900 |
| 4,244,033 A | 1/1981 | Hattori | 364/900 |
| 4,472,805 A | 9/1984 | Wacyk et al. | 371/51 |
| 4,523,301 A | 6/1985 | Kadota et al. | 365/49 |
| 4,646,271 A | 2/1987 | Uchiyama et al. | 365/49 |
| 4,656,626 A | 4/1987 | Yudichak et al. | 370/68 |
| 4,670,858 A | 6/1987 | Almy | 365/49 |
| 4,747,080 A | 5/1988 | Yamada | 365/200 |
| 4,758,982 A | 7/1988 | Price | 364/900 |
| 4,780,845 A | 10/1988 | Threewitt | 365/49 |
| 4,785,398 A | 11/1988 | Joyce et al. | 364/200 |
| 4,791,606 A | 12/1988 | Threewitt | 365/49 |
| 4,813,002 A | 3/1989 | Joyce et al. | 365/49 |
| 4,845,668 A | 7/1989 | Sano et al. | 365/49 |
| 4,903,234 A | 2/1990 | Sakuraba et al. | 365/49 |
| 4,928,260 A * | 5/1990 | Chuang et al. | 365/49 |
| 4,958,377 A | 9/1990 | Takahashi | 342/34 |
| 4,959,811 A | 9/1990 | Szczepanek | 365/49 |
| 4,975,873 A | 12/1990 | Nakabayashi et al. | 365/49 |
| 4,996,666 A | 2/1991 | Duluk, Jr. | 365/49 |
| 5,010,516 A | 4/1991 | Oates | 365/49 |
| 5,014,195 A | 5/1991 | Farrell et al. | 364/200 |
| 5,036,486 A | 7/1991 | Noguchi et al. | 365/49 |
| 5,051,948 A | 9/1991 | Watabe et al. | 365/49 |
| 5,053,991 A | 10/1991 | Burrows | 365/49 |
| 5,072,422 A | 12/1991 | Rachels | 365/49 |
| 5,107,501 A | 4/1992 | Zorian | 371/213 |
| 5,111,427 A | 5/1992 | Kobayashi et al. | 365/49 |
| 5,226,005 A | 7/1993 | Lee et al. | 365/49 |
| 5,265,100 A | 11/1993 | McClure et al. | 371/21.2 |
| 5,383,146 A | 1/1995 | Threewitt | 365/49 |
| 5,396,449 A * | 3/1995 | Atallah et al. | 365/49 |
| 5,414,704 A | 5/1995 | Spinney | 370/60 |
| 5,440,709 A | 8/1995 | Edgar | 395/401 |
| 5,440,715 A * | 8/1995 | Wyland | 711/108 |
| 5,454,094 A | 9/1995 | Montoye | 395/435 |
| 5,455,576 A | 10/1995 | Clark, II et al. | 341/50 |
| 5,469,161 A | 11/1995 | Bezek | 341/51 |
| 5,485,418 A | 1/1996 | Hiraki et al. | 365/49 |
| 5,490,102 A | 2/1996 | Jurban | 365/49 |
| 5,491,703 A | 2/1996 | Barnaby et al. | 371/40.1 |
| 5,513,134 A | 4/1996 | Cooperman et al. | 365/49 |
| 5,517,441 A | 5/1996 | Dietz et al. | 365/49 |
| 5,621,677 A | 4/1997 | Jones | 365/49 |
| 5,649,149 A | 7/1997 | Stormon et al. | 395/435 |
| 5,706,224 A | 1/1998 | Srinivasan et al. | 365/49 |
| 5,818,873 A | 10/1998 | Wall et al. | 375/240 |
| 5,841,874 A * | 11/1998 | Kempke et al. | 380/50 |
| 5,860,085 A | 1/1999 | Stormon et al. | 711/108 |
| 5,893,931 A | 4/1999 | Peng et al. | 711/206 |
| 5,905,668 A | 5/1999 | Takahashi et al. | 365/49 |
| 5,930,359 A * | 7/1999 | Kempke et al. | 380/9 |
| 5,946,704 A | 8/1999 | Yoneda et al. | |
| 6,081,442 A | 6/2000 | Igarashi et al. | 365/49 |

OTHER PUBLICATIONS

Anthony J. McAuley, et al., "A Self–Testing Reconfigurable CAM", IEEE Journal of Solid–State Circuits, vol. 26, No. 3, Mar. 1991, pp. 257–261.

Yong–Chiu Shin, et al., "A Special–Purpose Content Addressable Memory Chip for Real–Time Image Processing", IEEE Journal of Solid–State Circuits, vol. 27, May 1992, pp. 737–744.

KLSI, "Address Processor" KE5B064H series—Dual Port and Fixed Table Type–, Version 1.0.1, published approximately late 1995 or early 1996, pp. 1–1 through 14–1.

KLSI, "KE5B064A1 Address Processor" Version 2.0.2, published approximately late 1995 or early 1996, pp. 1–1 through 12–1.

Motorola Semiconductor Technical Data, "Advance Information 16K = 64 CAM" MCM69C432, Jan. 1996, pp. 4 pages total.

Hiroshi Kadota, et al., "An 8–kbit Content–Addressable and Reentrant Memory", IEEE Journal of Solid–State Circuits, vol. SC–20, No. 5, Oct. 1985, pp. 951–956.

Landrock et al., "Associative Storage Module", IBM Technical Disclosure Bulletin, vol. 25, No .5, Oct. 1982, pp. 2341–2342.

Soo–Ik Chae, et al. "Conten–Addressable Memory for VLSI Pattern Inspection", IEEE Journal of Solid–State Circuits, vol. 23, No. 1, Feb. 1988, pp. 74–78.

Sergio R. Ramirez–Chavez, "Encoding Don't Care in Static and Dynamic Content–addressable Memories", Transaction Briefs IEEE Transactions on Circuits and System–II: Analog and Digital Signal Processing, vol. 39, No. 8, Aug. 1992, pp. 575–578.

Advanced Micro Devices, "Final Am99C10A 256= 48 Content Addressable Memory" Publication No. 08125, Rev. G., Dec. 1992, pp. 1–21.

Music Semiconductors, "MU9C1480 LANCAM" Advance Information, Mar. 22, 1990, pp. 1–11.

Music Semiconductor, The MU9C1480 LANCAM Handbook, Rev. 3, Nov. 1994, pp. 1–1 through 7–12.

Music Semiconductors, "MU9C1480 LANCAM™" Preliminary Specification, Jan .15, 1991, Rev. O, p. 1 page total.

Music Semiconductors, "MU9C2480 LANCAM Preliminary Data Sheet", Aug. 25, 1995, pp. 1–24.

Music Semiconductors, "MUAA™ CAM Family" Advance Information, Feb. 24, 1998, Rev. O, pp. 1–16.

GEC Plessey Semiconductors Preliminary Information, "P2800 2K= 64 Bit Multi–Port Content Addressable Memory", Feb. 1997, pp. 1–15.

GEC Plessey Semiconductors, "P2800 Multi–port Content Addressable Memory Functional Product Specification GPS–FPS–2800–12", Jan. 1996, pp. 1–102.

Ian N. Robinson, Hewlett–Packard Laboratories, "Pattern–Addressable Memory", Jun. 1992, pp. 20–30.

Keikichi Tamaru, "The Trend of Functional Memory Development", Invited Paper Special Issue on LSI Memories, IEICE Trans. Electron, vol. E76–C, No. 11, Nov. 1993, pp. 1545–1554.

U.S. Patent application No. 08/967,314, entitled "Synchronous Content Addressable Memory with Single Cycle Operation", filed on Oct. 30, 1997, p. 47 total.

U.S. Patent application No. 09/001,110, entitled "Method and Apparatus for Cascading Content Addressable Memory Devices", filed on Dec. 30, 1997, p. 36 total.

U.S. Patent application No. 09/076,336, entitled "Method and Apparatus for Implementing a Learn Instruction in a Depth Cascaded Content Addressable Memory System", filed on May 11, 1998, p. 64 total.

U.S. Patent application No. 09/076,337, entitled "Method and Apparatus for Implementing a Learn Instruction in a Content Addressable Memory Device", filed on May 11, 1998, p. 64 total.

* cited by examiner

| MMR_RESET 165 | 254 | WORD LINE 208 | MMRWL 256 |
|---|---|---|---|
| 0 | 0 | 0 | 1 |
| 0 | 0 | 1 | 1 |
| 0 | 1 | 1 | 1 |
| 1 | 1 | 0 | 1 |

FIG. 9

METHOD AND APPARATUS FOR PERFORMING A READ NEXT HIGHEST PRIORITY MATCH INSTRUCTION IN A CONTENT ADDRESSABLE MEMORY DEVICE

FIELD OF THE INVENTION

The present invention relates generally to content addressable memory (CAM) devices, and more particularly to accessing multiple match locations in a CAM device.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. The CAM device typically indicates if a match occurs by asserting a match flag, and also typically indicates if multiple matches occur by asserting a multiple match flag. The CAM device can then be instructed to output the highest priority match address or index, data stored in one or more CAM cells at the matching address, and other status information including the match flags, a full flag, validity bits (e.g., skip and empty bits), and other status information.

It would be desirable to provide a CAM device that can efficiently access the highest priority matching location in response to a first instruction, and then access a subsequent lower priority matching location in response to a single second instruction.

SUMMARY OF THE INVENTION

A content address memory (CAM) device is disclosed that implements a read next highest priority or "RNHPM" instruction. The CAM device initially searches its CAM locations for a match with comparand data. If multiple matches are identified, then the CAM device initially outputs the highest priority matching address. The CAM device may output the highest priority matching address in the same system or a later clock cycle in which the compare instruction was provided. The CAM device may also output data stored in one or more of the CAM cells located at the highest priority matching location and/or status information including the match flags, a full flag, validity bits (e.g., skip and empty bits), and other status information. An RNHPM instruction may then be provided to the CAM device in the next clock cycle or a later clock cycle and cause the next highest priority matching address to be output by the CAM device. The next highest priority matching address may be output in the same or subsequent cycle as the RNHPM instruction and may also cause the CAM device to output data stored in one or more of the CAM cells located at the next highest priority matching location and/or status information for that location. RNHPM instructions can continue to be supplied to the CAM device until no further matching locations are detected.

For one embodiment, the CAM array includes a column of multiple match ("MMR") bits that are used by the RNHPM instruction to resolve a multiple match condition. The MMR bits store an indication of whether the corresponding CAM location has a match with the comparand data. For one example, the MMR bits are set to logic zeros at the beginning of the initial compare instruction. When it is determined which locations in the CAM array match the comparand data, then the MMR bits for those locations are updated to a logic one except for the highest priority matching location. In response to a subsequent RNHPM instruction, only the MMR bits need to be queried (e.g., compared with a logic one) to determine the next highest priority matching location. The match address of the next highest priority matching location, data stored in one or more of the CAM cells at the next highest priority matching location, and/or other status information may then be output from the CAM device. The MMR bit for that matching location is then reset to a logic zero such that a subsequent RNHPM instruction can then access lower priority matching locations by using the MMR bits.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 9 is a truth table summarizing the logical operation of the MMR word line control logic of FIG. 10;

DETAILED DESCRIPTION

Figure 1:
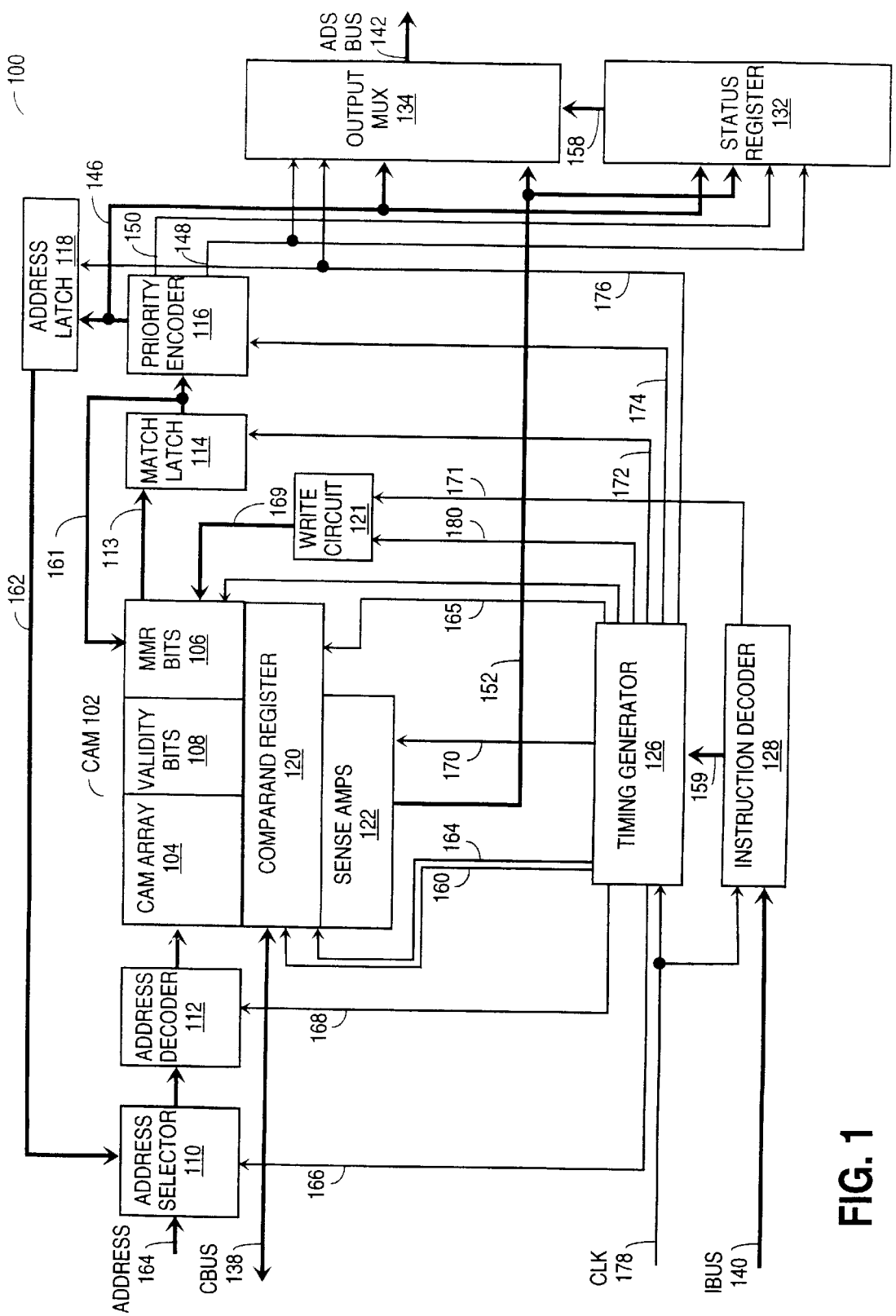
FIG. 1 is a block diagram of one embodiment of a CAM device according to the present invention.

A content addressable memory (CAM) device is disclosed. In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicate that the signal is an active low signal. Each of the active low signals may be changed to active high signals as generally known in the art.

A content addressable memory (CAM) device is disclosed that implements a read next highest priority or "RNHPM" instruction. In response to a compare instruction, the CAM device initially searches its CAM locations for a match with comparand data. The comparand data may be provided on an external comparand bus or be stored in a comparand register and may be masked by one or more mask registers. If multiple matches are identified, then the CAM device initially outputs the highest priority matching address. The CAM device may output the highest priority matching address in the same system or a later clock cycle in which the compare instruction was provided. The CAM device may also output data stored in one or more of the CAM cells located at the highest priority matching location and/or status information including the match flags, a full flag, validity bits (e.g., skip and empty bits), and other status information. A RNHPM instruction may then be provided to the CAM device in the next clock cycle or a later clock cycle and cause the next highest priority matching address to be output by the CAM device. The next highest priority matching address may be output in the same cycle as the RNHPM instruction and may also cause the CAM device to output data stored in one or more of the CAM cells located at the next highest priority matching location and/or status information for that location. RNHPM instructions can continue to be supplied to the CAM device until no further matching locations are detected.

For one embodiment, as will be described in more detail below, the CAM array includes a column of multiple match ("MMR") bits that are used by the RNHPM instruction to resolve a multiple match condition. The MMR bits store an indication of whether the corresponding CAM location has a match with the comparand data. For one example, the MMR bits are set to logic zeros at the beginning of the initial compare instruction. When it is determined which locations in the CAM array match the comparand data, then the MMR bits for those locations are updated to a logic one except for the highest priority matching location. In response to a subsequent RNHPM instruction, only the MMR bits need to queried (e.g., compared with a logic one) to determine the next highest priority matching location. The match address of the next highest priority matching location, data stored in one or more of the CAM cells at the next highest priority matching location, and/or other status information may then be output from the CAM device. The MMR bit for the next highest priority matching location is then reset to a logic zero such that a subsequent RNHPM instruction can access subsequent matching locations using the MMR bits. For another embodiment, the MMR bits that matched the query (e.g., matched a one) are written again to a logic one while the next highest priority match is set to zero by the RNHPM instruction.

The present CAM device advantageously allows for increased system performance in circumstances where a CAM device has multiple matching locations with comparand data. The highest priority matching location and/or data stored at that location can be accessed in response to an initial compare instruction. Subsequent RNHPM instructions can then be provided to access lower priority matching locations and/or data stored at lower priority locations in one or more clock cycles. No additional instructions or external pins are required to perform these functions or access the MMR bits. The CAM device does not need to be reset before or after the RNHPM instruction. Additionally, if the CAM device includes validity bits such as skip and empty bits, then these bits are not affected by the RNHPM instruction. The CAM device also does not need to store the comparand data (or mask data) used for the initial compare instruction.

FIG. 1 shows CAM device 100 that is one embodiment of a CAM device that may implement the RNHPM instruction of the present invention. CAM 100 is a synchronous CAM device that performs its operations in response to an external clock signal CLK 178. It will be appreciated, however, that alternative embodiments of the present invention may be implemented in asynchronous CAM devices.

CAM device 100 may include an instruction bus IBUS 140 for receiving instructions, a separate comparand bus CBUS 138 for receiving comparand data to be compared with one or more CAM cells of CAM array 104, and a separate data bus ADS BUS 142. For an alternative embodiment, one or more of buses 138, 140, and 142 may be shared or time multiplexed. ADS BUS 142 may simultaneously or individually output: a match address or CAM index for a location of CAM array 104 that matches the comparand data; data stored in one or more of the CAM cells of the CAM array, wherein the data may be associated with the matched address; and/or status information corresponding to the matched address or associated data. The status information may include a match flag, multiple match flag, full flag, skip bit, empty bit, and/or other identification for CAM device 100. ADS BUS 142 may be any size to accommodate any number of bits. For one embodiment, ADS BUS 142 is a 64-bit bus. ADS BUS 142 may be buffered or registered.

CBUS 138 may be a bi-directional bus used to provide comparand data to comparand register 120 or directly to CAM array 104 of CAM 102. CBUS 138 may also be coupled to status register 132, CAM 102, and one or more mask registers (not shown). CBUS 138 may be any size to accommodate any number of bits of comparand data. For one embodiment, CBUS 138 is a 64-bit bus. CBUS 138 may be buffered or registered.

IBUS 140 is used to provide instructions to instruction decoder 128. Instructions may be clocked into instruction decoder 128 from IBUS 140 by external clock signal CLK 178 or by one or more clock signals output from a clock buffer (not shown) that may generate clock signals having varying phases and frequencies. IBUS 140 may be any size to accommodate any number of bits and any number of instructions. For one embodiment, IBUS 140 is 14 bits wide to accommodate $2^{14}$ unique possible binary coded instructions. Other encodings may be used. IBUS 140 may be buffered or registered. Instruction decoder 128 decodes the instructions on IBUS 140 and provides one or more control signals to timing generator 126 over signal line(s) 159. Timing generator 126 may then output the appropriate control signals to the various circuits to implement an RNHPM instruction.

Output multiplexer 134 provides data to ADS BUS 142. Output multiplexer 134 may include output buffers, one or more multiplexers, a selector circuit, registers, or latches. Output multiplexer 134 may receive a matching CAM address or index from priority encoder 116 via bus 146, and may also receive data stored in CAM array 104 via sense amplifiers 122 and bus 152. Additionally, output multiplexer 134 may receive status information including a match flag signal (/MFINT) from priority encoder 116 via signal line 148, a multiple match flag (/MMF) from priority encoder 116 via signal line 150, and/or validity bits 108 (e.g., via a bus not shown). Output multiplexer 134 may additionally receive one or more of the MMR bits 106. Output multiplexer 134 may also receive all or some of the above-described data from status register 132 via bus 158. Status register 132 may comprise one or more registers.

CAM device 100 also includes CAM 102. CAM 102 includes a CAM array 104 that may be organized in any number of rows and columns of CAM cells. CAM 102 may also include validity bits 108 that store information about corresponding locations in CAM array 104. For example, the validity bits for a given row or location in CAM array 104 may include a skip bit and an empty bit. The validity bits may indicate that a particular location in CAM array 104 should be skipped when performing a compare operation with comparand data stored in comparand register 120. The validity bits may also indicate that a corresponding location in CAM array 104 is empty. The validity bits also group the CAM cells into four states as indicated in Table 1. A comparison operation may compare comparand data against any of the locations in CAM array 104 that correspond to a given state.

TABLE 1

| SKIP | EMPTY | STATE |
|------|-------|-------|
| 0 | 0 | VALID |
| 0 | 1 | EMPTY |
| 1 | 0 | SKIP |
| 1 | 1 | RAM |

CAM 102 additionally includes MMR bits 106. MMR bits 106 may be one or more columns of bits that store the match results for a corresponding row of CAM cells in CAM array 104. These bits may be writable, readable, and/or maskable, and it will be described in greater detail below.

CAM 102 outputs match information on a plurality of match lines 113 to match latch 114. Match latch 114 latches the match data on the match lines in response to a signal on line 172, and provides the match information to priority encoder 116. Priority encoder 116 may determine the highest priority match address and may also generate internal match flag signal /MFINT on line 148 and multiple match flag /MMF on line 150.

Figure 2:
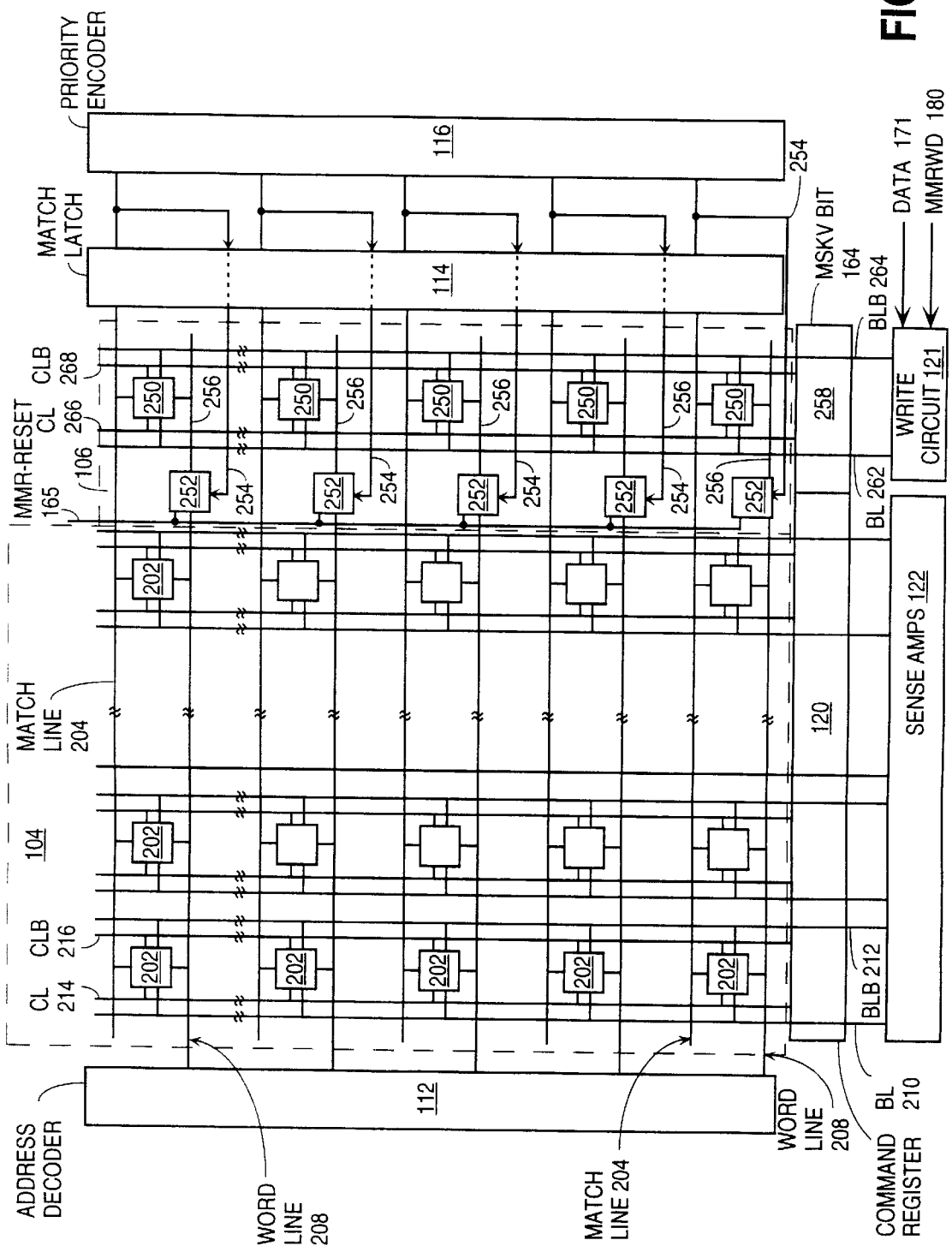
FIG. 2 is block diagram of one embodiment of the CAM array of FIG. 1 including a column of MMR bits.

FIG. 2 shows one embodiment of CAM array 104 having a plurality of CAM cells 202 organized in any number of rows and columns. For one embodiment, CAM array 104 may include approximately 4k (i.e., 4096) rows of CAM cells 202 and approximately 64 columns of CAM cells 202. For another embodiment, CAM array 104 may include approximately 4k rows of CAM cells 202 and approximately 128 columns of CAM cells 202. The validity bits have been omitted from FIG. 2 for the sake of clarity, but may also be included in additional rows and columns of CAM cells.

Each row of CAM cells is coupled to a match line 204 and a word line 208. Each word line 208 is driven by address decoder 112 to select one or more of CAM cells 202 for writing or reading. Each match line 204 is coupled to match latch 114 that latches the match results of a comparison operation. An individual match line will indicate a match only if all of the CAM cells 202 (actually compared) in that row match the comparand data. The latch results are then provided to priority encoder 116 which generates an address corresponding to at least one of the matched addresses. For one embodiment, the matched address is the highest priority match address. The highest priority match address may be the lowest numbered matching address, the highest numbered matching address, or any other selected matching address. Alternatively, the match address may be the lowest priority match address, or any other predetermined priority.

Each column of CAM cells is coupled to a bit line (BL) 210, a complementary bit line (BLB) 212, a compare line (CL) 214, and a complementary compare line (CLB) 216. BL 210 and BLB 212 are coupled to sense amplifiers 122 that may enable data to be read from or written to CAM cells 202. CL 214 and CLB 216 are coupled to comparand register 120 and provide comparand data to CAM cells 202 for comparison purposes. For alternative embodiments, other CAM array architectures may be used. For example, CAM array 104 may not include CL 214 and CLB 216; rather, BL 210 and BLB 212 may be coupled to comparand register 120 and may be used to perform a comparison with data stored in CAM cells 202 as generally known in the art. For example, in the first part of a compare cycle time, compare data may be provided onto BL 210 and BLB 212 from comparand register 120. In the second part of the compare cycle time, BL 210 and BLB 212 may be driven with data to be output from CAM array 104.

Figure 3:
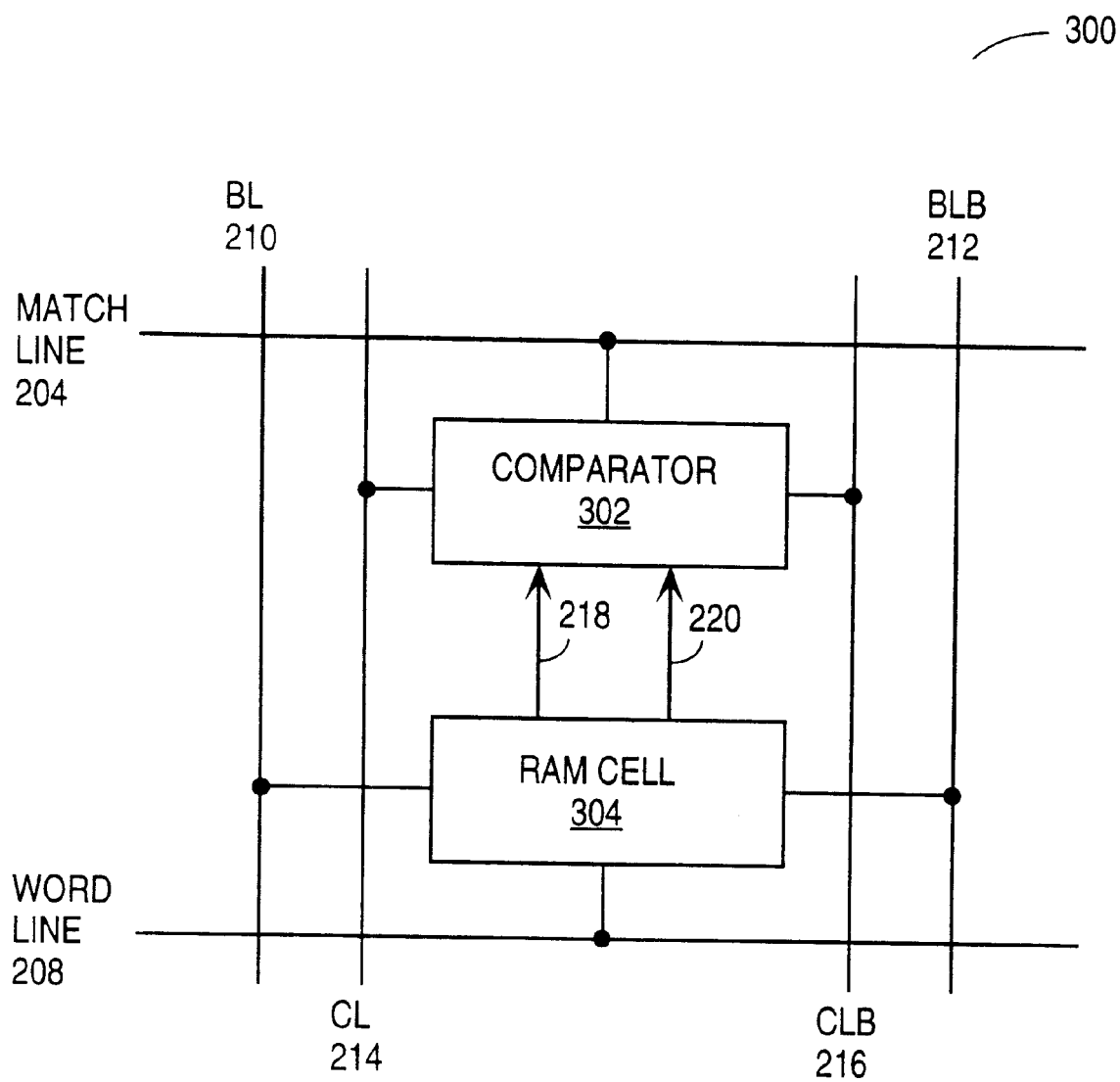
FIG. 3 is a block diagram of one embodiment of a CAM cell.

FIG. 3 shows CAM cell 300 that is one embodiment of a CAM cell 202. CAM cell 300 includes comparator 302 and RAM cell 304. RAM cell 304 is coupled to BL 210, BLB 212, and word line 208, and may be any type of RAM cell. When RAM cell 304 is selected by word line 208, data may be read from or written to RAM cell 304 via bit lines BLB 210 and BLB 212. Comparator 302 is coupled to RAM cell 304, CL 214, CLB 216, and match line 204. Comparator 302 may compare data from comparand register 120 (supplied on CL 214 and CLB 216) with data stored in RAM cell 304 (supplied on lines 218 and 220), and output the comparison result to match line 204. Comparator 302 may be any type of comparison circuit including an exclusive OR (XOR) or exclusive NOR (XNOR) gate. The comparison and write or read function of CAM cell 300 may be performed simultaneously or sequentially. In alternative embodiments (e.g., CL 214 and CLB 216 omitted), the comparison and read or write function may be performed sequentially. Because of the separate bit lines and compare lines, CAM cell 300 may perform a comparison operation at the same time that data is read from RAM cell 304. This may be advantageous in performing compare operations in CAM devices such as CAM device 100 of FIG. 1.

With respect to FIG. 2, CAM array 104 may store associative memory data or compare data (e.g., port address, pattern recognition keys, etc.) in any number of CAM cells 202 of a given row of CAM cells. The compare data may be compared with comparand data stored in comparand register 120. Similarly, CAM array 104 may store associated data or RAM data (e.g., bridge or switch port address, access information, or aging data) in any number of CAM cells 202 of a given row of CAM cells. The associated data may correspond to, or be associated with, other CAM cells in the same row that store compare data. The CAM cells 202 may be partitioned with a granularity of one into compare data and associated data segments. The compare data and associated data segments may be interleaved, or they may be non-interleaved segments. For one embodiment, a memory configuration register (not shown) may be used to program which bits in CAM array 104 are used to store compare data, and which bits are used to store associated data.

The associated data may be output from CAM array 104 (e.g., via sense amplifiers 122 and output multiplexer 134) in any order or in any format. For one embodiment, CAM array 104 may output its contents in multi-bit segments. Each segment may store compare data, associated data, or other information. For one example, CAM array 104 may be partitioned into four segments of 16 bits each. One or more of the segments may be sensed and output by output multiplexer 134 in any order (e.g., $2^4$ or 16 possible ordered outputs).

FIG. 2 also shows one embodiment of MMR bits 106. MMR bits 106 include an MMR CAM cell 250 and an MMR word line control logic 252 for each corresponding row of CAM cells 202 in CAM array 104. Each MMR word line control logic 252 determines the selection of a corresponding MMR CAM cell 250 by controlling an independent, local MMR word line ("MMRWL") 256. Each MMR word line control logic 252 controls its MMRWL 256 for its corresponding MMR CAM cell 250 in response to word line 208, MMR_RESET on line 165, and a signal output from match latch 114 on line 254. The signal on line 254 received by each MMR word line control logic 252 corresponds to the latched match line for that given row of CAM cells 202 and MMR CAM cell 250.

Figure 11:
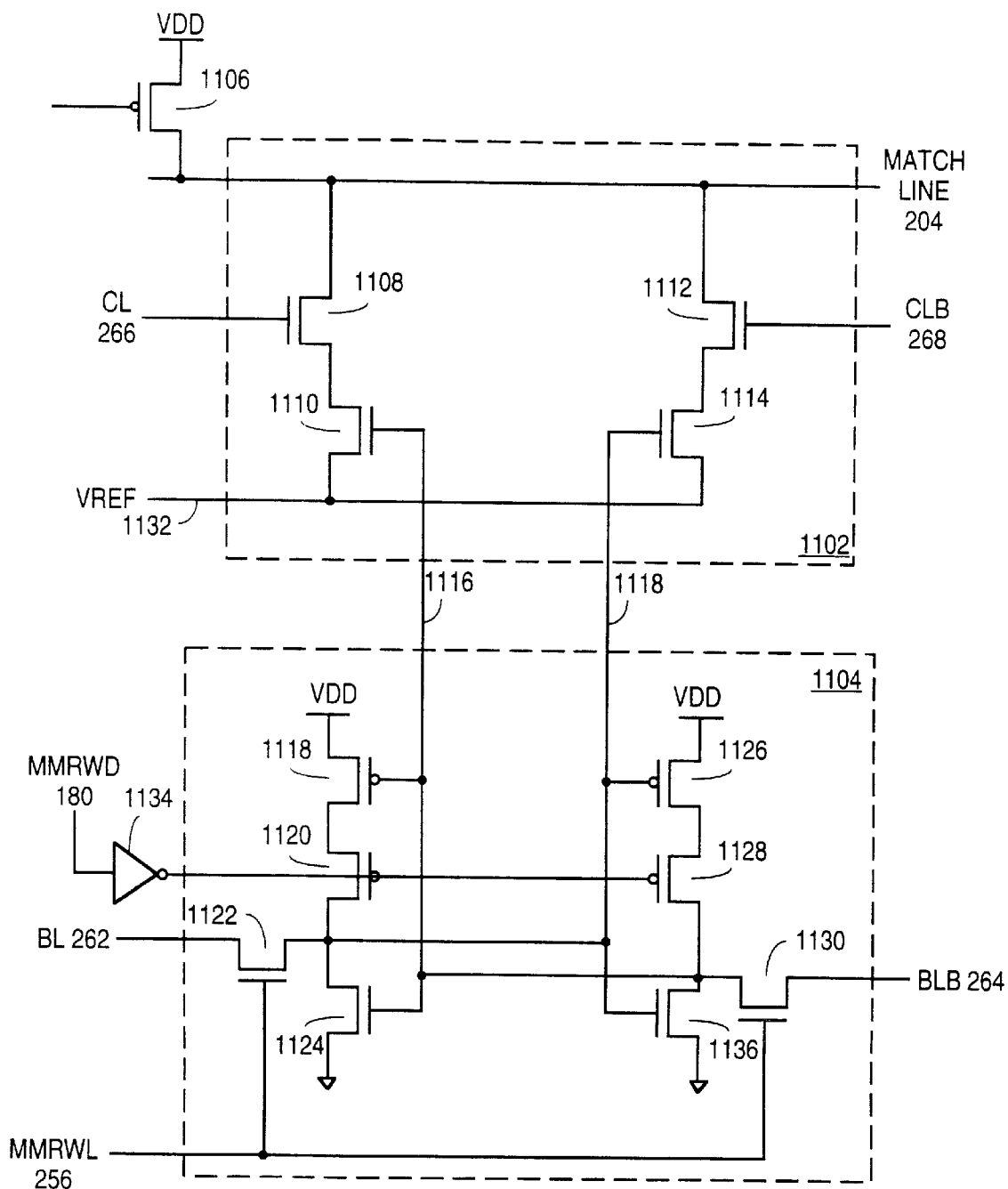
FIG. 11 is a circuit diagram of one embodiment of a MMR CAM cell of FIG. 2.

The MMR CAM cells 250 are coupled to the match lines 204 and may comprise the logic blocks as generally shown in FIG. 3. One specific embodiment of the MMR CAM cell is shown in FIG. 11 and will be described below. The MMR CAM cells 250 are coupled to MMR comparand register 258 which may be a segment of comparand register 120, or may be a separate comparand register. MMR comparand register 258 stores comparand data for the MMR CAM cells 250 and couples the comparand data to MMR CAM cells 250 on compare lines CL 266 and CLB 268. MMR comparand register 258 may also provide mask data to CL 266 and CLB 268 in response to the MSKVBIT signal on line 164. MMR CAM cells 250 may also receive write data on BL 262 and BLB 264 (from data on line 171) via write circuit 121. Write circuit 121 and MMR comparand register 258 may control when the write data is supplied to the MMR CAM cells 250, and write circuit 121 may control the logic levels of the data on BL 262 and BLB 264 in response to MMRWD on signal line 180.

Figure 4:
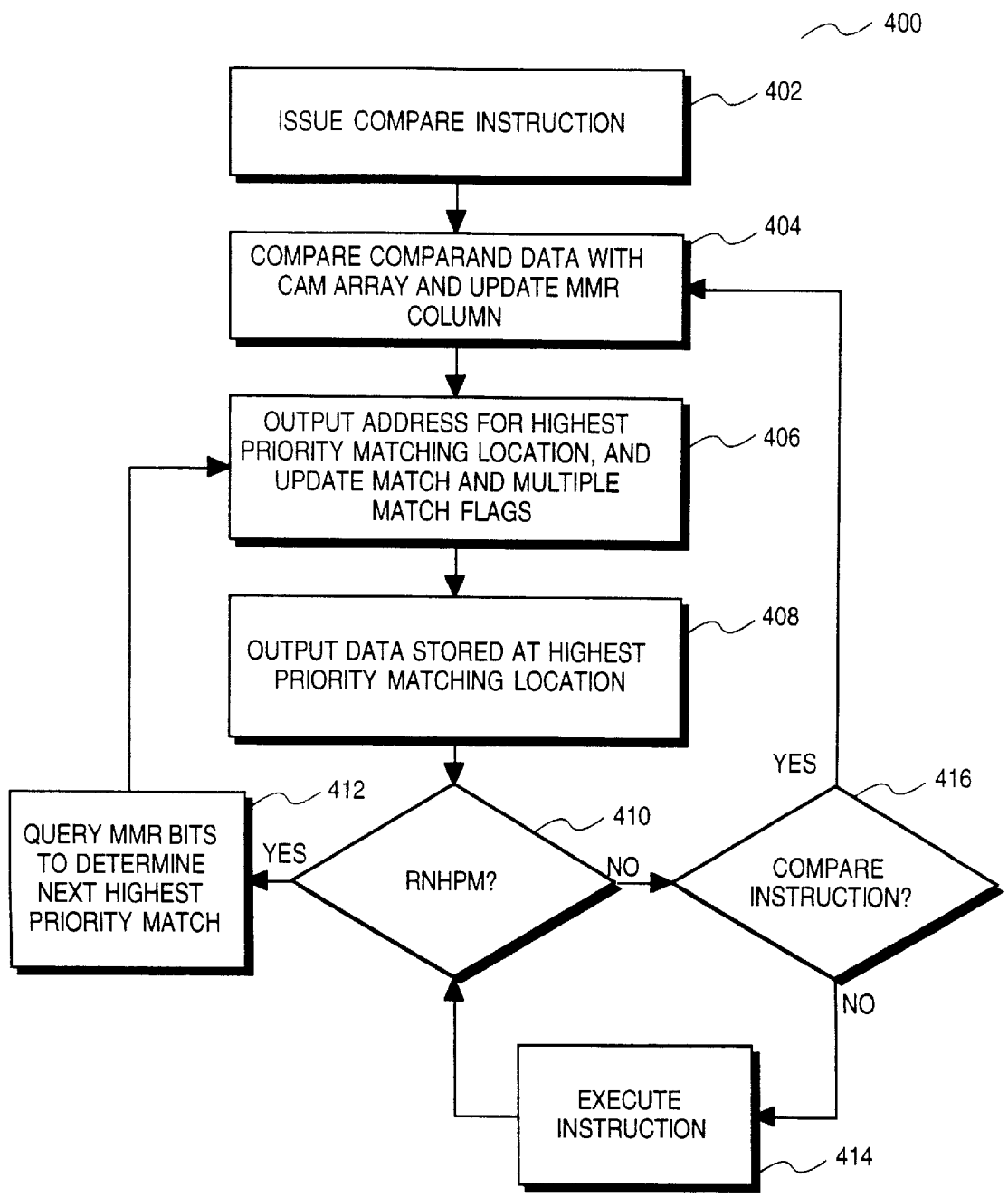
FIG. 4 is one embodiment of a method of performing compare and RNHPM instructions.

FIG. 4 describes one embodiment 400 of generally performing compare and RNHPM instructions in CAM device 100. The process may be used to perform the compare operation in one or more clock cycles, and may also be used to perform the RNHPM instruction in one or more later clock cycles. At step 402, instruction decoder 128 decodes a compare instruction provided on IBUS 140. Instruction decoder 128 may include a look-up table, a state machine, or any other control logic that can decode the compare instruction on IBUS 140. In response to the compare instruction, comparand register 120 may load comparand data from CBUS 138. Alternatively, the comparand data may not be loaded into comparand register 120, but may remain on CBUS 138 for step 404.

At step 404, the comparand data is compared with data stored in CAM array 104 to determine if there is a match. One or more bits of the comparand data may be masked by mask registers (not shown) coupled to CAM array 104. The MMR bits 106 for the matching locations may then be updated to indicate which locations in CAM array 104 (and/or validity bits 108) match the comparand data. For one embodiment, the MMR bit associated with the highest priority matching address may not be updated during the compare cycle. The comparison results of the step 404 will be reflected by the state of match lines 113.

At step 406, CAM device 100 may output the match address of the highest priority match location to ADS BUS 142, and the match flag and multiple match flag may be generated. At step 408, data stored in one or more of the CAM cells at the highest priority matching location of CAM array 104 may be optionally output to ADS BUS 142. Steps 402–408 may be completed in one clock cycle of CLK 178.

If the next instruction received by CAM device 100 is an RNHPM instruction at step 410, then at step 412 CAM device 100 queries only the MMR bits to determine the next highest priority match address. CAM device 100 can query the MMR bits by comparing the MMR bits with a logic one value to determine the next highest priority matching address. No comparison of the comparand data with CAM array 104 (and/or validity bits 108) is required. The MMR bits then update match lines 113 and steps 406–408 are repeated. Steps 406–412 can be repeated until all matching locations have been exhausted. If the instruction received after the initial compare instruction is not an RNHPM instruction but is another compare instruction (step 416), then the process returns to step 404 and the MMR bits are updated to correspond to the new match results. If, however, the next instruction is neither a compare instruction or an RNHPM instruction, CAM device 100 executes the next instruction at step 414 and is still able to execute a subsequent RNHPM instruction because only compare instructions affect the MMR bits. In alternative embodiments, if the subsequent instruction changes, renders invalid, or flags as "skip" the data stored in those CAM cells previously indicated as containing data matching the comparand data of the initial compare instruction of step 402, then the MMR bits for those locations may be cleared to logic zeros.

Figure 5:
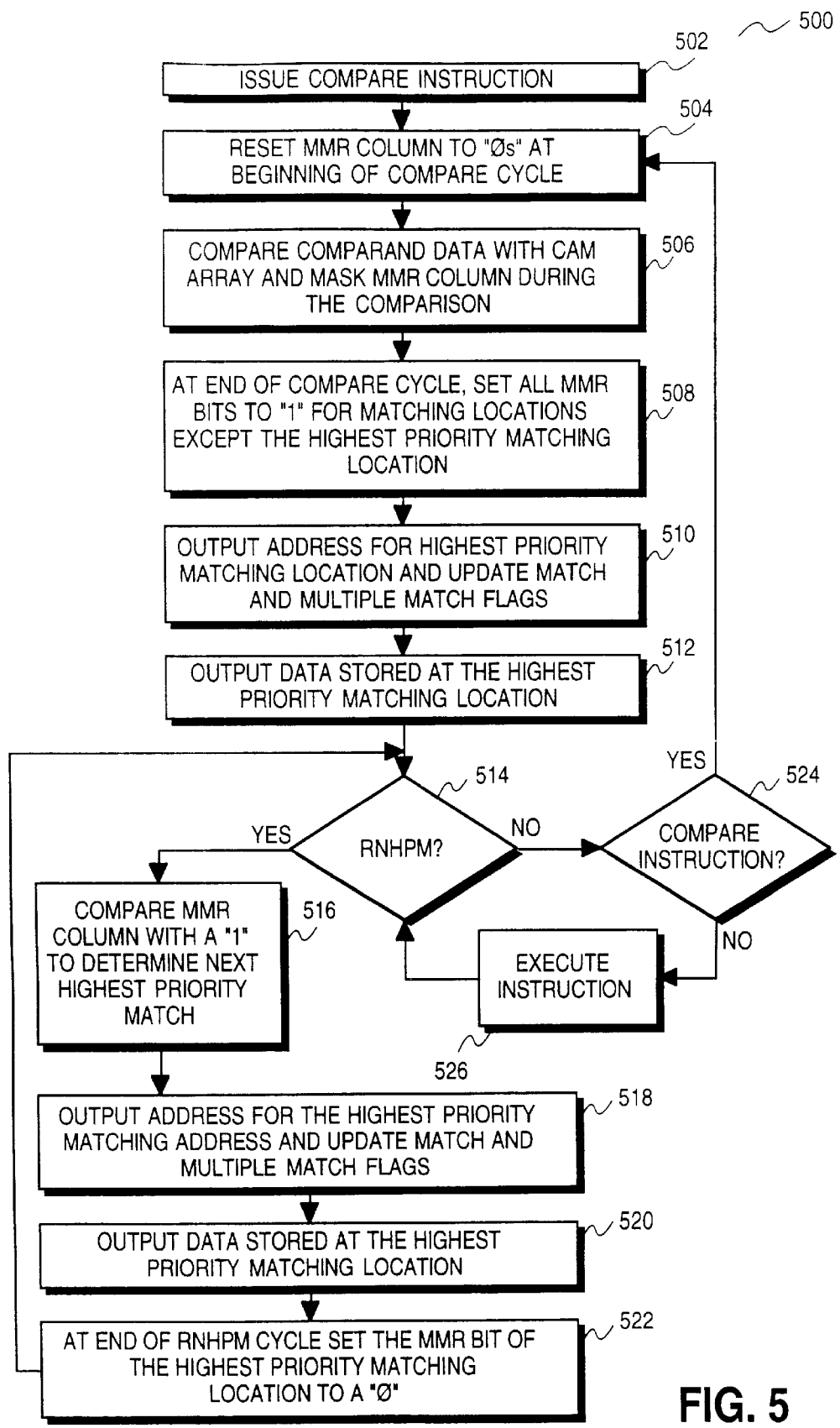
FIG. 5 is a more detailed embodiment of the method of performing compare and RNHPM instructions of FIG. 4.

FIG. 5 shows one embodiment of a more detailed flow diagram implementing compare and RNHPM instructions which can be implemented by CAM device 100 and CAM 102 as illustrated in FIG. 2. The process will be described with the aid of the illustrative timing diagrams shown in FIGS. 6 and 7 and with reference to FIGS. 1 and 2. Steps 502–512 describe the compare instruction illustrated in FIG. 6, and steps 514–522 illustrate the RNHPM instruction illustrated in FIG. 7.

At step 502 and time t0, instruction decoder 128 receives and decodes the compare instruction on IBUS 140 in response to the start of a clock cycle of CLK 178. In response to the compare instruction and at time t1 (or between times t0 and t1), instruction decoder 128 may send one or more signals (not shown in FIG. 6) on bus 159 indicating that a compare instruction has been received by CAM device 100. The signal(s) on bus 159 may be a pulse signal that is asserted or deasserted for any appropriate length of time. In response, timing generator 126 may send a signal on line 160 at time t1 such that comparand data on CBUS 138 is loaded into comparand register 120. As previously described, the comparand data may alternatively not be loaded into comparand register 120, but may be directly compared with CAM array 104 from CBUS 138.

The compare instruction also causes CAM device 100, at step 504, to reset the MMR bits to a logic zero at the beginning of the compare cycle. This may be accomplished by setting MMR_RESET on line 165 to a high state at time t1, providing a logic zero as data on line 171 to write circuit 121, and pulsing (or setting) the MMRWD signal on line 180 to a high state. Pulsing MMR_RESET on line 165 to a high state causes MMR word line generation blocks 252 to drive MMRWLs 256 of each MMR CAM cell 250 to a high state such that the logic zero on BL 262 (and logic one on BLB 264) is written into the MMR CAM cells 250. When MMR_RESET on line 165 is returned to a logic zero state, then MMR word line generation blocks 252 disable the MMRWLs 256 such that MMR CAM cells 250 retain the logic zeros.

At step 506, the comparand data is then compared against one or more CAM cells in CAM array 104 while the MMR bits are masked so as not to affect the comparison. Masking of the MMR bits can be accomplished by timing generator 126 driving MSKVBIT to a high state on line 164 during the comparison operation. In response to the high state on line 164, MMR comparand register 258 will drive CL 266 and CLB 268 to appropriate states to mask the MMR CAM cells 250 from the comparison (e.g., both CL and CLB low).

At time t2, the match results on match lines 113 are latched by match latch 114 in response to a signal on line 172. The signal on line 172 may be, for example, a self-timed signal or a clock signal (such as CLK 178 or a derivative thereof). The latched match signals are coupled to priority encoder 116. Timing generator then sends a signal on line 174 at time t3 to signal priority encoder 116 to start encoding the latched match line data. Alternatively, no signal on line 174 is required and priority encoder 116 starts to encode the latched match line data immediately. Priority encoder 116 then determines if there is a match, and outputs match flag signal /MFINT on line 148 and a multiple match signal /MMF on line 150. Priority encoder 116 also determines the highest priority matching address from the match results output by match latch 114. At time t4, the outputs of priority encoder 116 may be latched into address latch 118 in response to a signal on line 176. The outputs of priority encoder 116 are also provided to bus 146, output multiplexer 134, and status register 132. For an alternative embodiment, the output of priority encoder 116 is supplied to bus 162 without being latched by address latch 118. The highest priority matching address may then be output to ADS BUS 142 before the end of the clock cycle (e.g., by time t9).

The compare operation then enables data stored in one or more of the CAM cells of CAM array 104 to be output to ADS BUS 142 during the same or later clock cycles. This may be accomplished by timing generator 126 asserting a signal on line 166 at time t5 causing address selector 110 to provide the highest priority matching address to address decoder 112. Address decoder 112 may then provide the decoded address to CAM array 104 in response to a signal on line 168 at time t6. Alternatively, a signal on line 168 may not be required. CAM array 104 may then access the highest priority match address in CAM array 104 and selected data in one or more CAM cells of CAM array 104 (and/or validity bits and/or MMR bits 106) may be read out and supplied to output multiplexer 134 and status register 132 via sense amplifiers 122. Sense amplifiers 122 may be enabled at time t8, or their outputs latched by a signal on line 170. The selected data may be stored in one CAM cell, groups of CAM cells, and/or CAM cells that did not participate in the previous search. The highest priority match address on bus 146, the data from CAM array 104 on bus 152, (and/or the validity bits, the MMR bits, and/or other status information) may then be output to ADS BUS 142 via output multiplexer 134 by time t9 (at steps 510 and 512).

Figure 6:
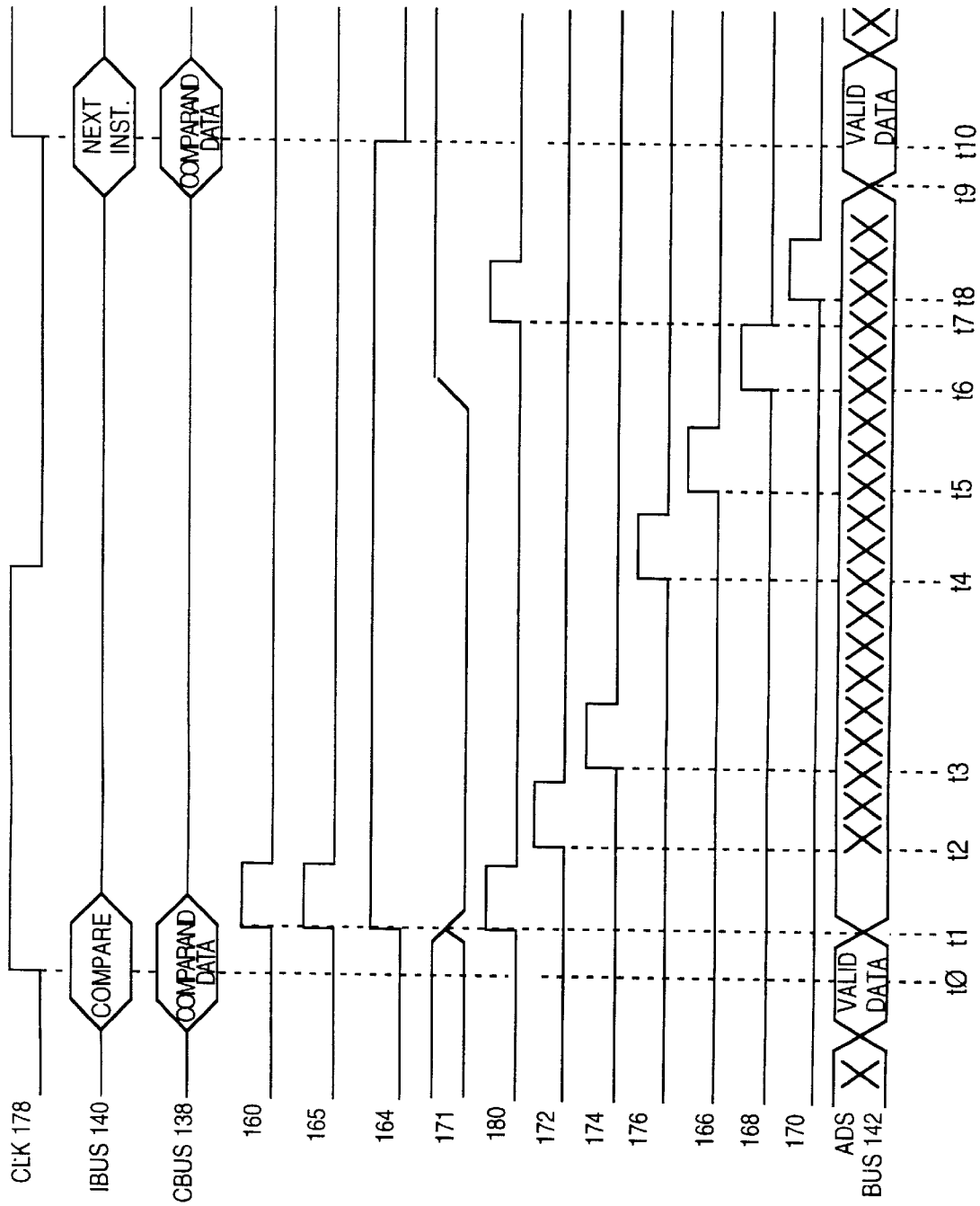
FIG. 6 is a timing diagram for one embodiment of a compare instruction and its affect on the MMR bits.

At step 508 and at the end of the compare instruction illustrated in FIG. 6, all of the MMR CAM cells 250 corresponding to matching locations in CAM array 104 are loaded with a logic one except for the highest priority matching location. This may be accomplished by setting MMR_RESET to a low state on line 165, providing logic one data on line 171 to write circuit 121, and pulsing MMRWD on line 180 to a high state at time t7. MMR word line control logic 252 for each MMR CAM cell 250 will cause its associated MMRWL 256 to be asserted and write the high data from BL 262 if: (1) MMR_RESET is low; (2) there is a match for this row of CAM cells 202 as indicated by the latched match latch information on line 254; and (3) the corresponding word line 208 for the matched row of CAM cells is not set to a high logic state. When the word line 208 is set to a high logic state for a given row of CAM cells at the end of the compare operation, then this row of cells is the highest priority matching location. Thus, the MMR CAM cell 250 associated with this highest priority matching location will not be updated with a logic one such that subsequent RNHPM instructions can determine the next highest priority match address by querying only the MMR bits. The balance of the MMR CAM cells 250 which are associated with rows of CAM cells 202 that have data matching the comparand data will be updated with a logic one state provided by write circuit 121.

As shown in FIG. 6, steps 502–512 may be completed by CAM device 100 in one clock cycle of CLK 178. Alternatively, the compare instruction may be completed over several clock cycles.

Figure 7:
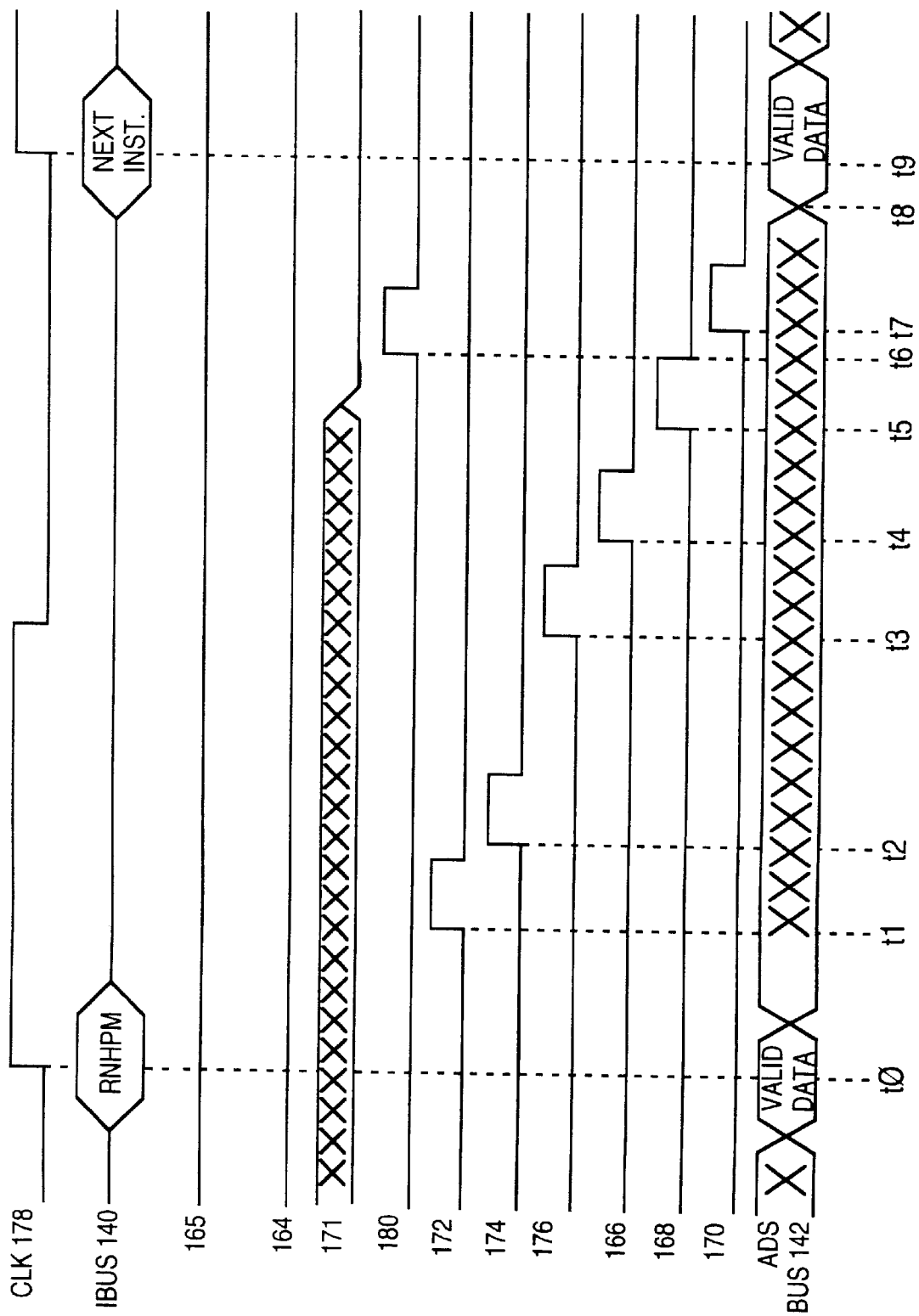
FIG. 7 is a timing diagram for one embodiment of an RNHPM instruction.

A subsequent instruction may now be performed by CAM device 100. If the subsequent instruction is not an RNHPM instruction as determined at step 510, then CAM device 100 determines if the next instruction is a compare instruction at step 524. If the next instruction is a compare instruction, then the process returns to step 504. If, however, the next instruction is neither a RNHPM instruction or a compare instruction, then the instruction is executed without generally affecting the MMR bits such that subsequently received RNHPM instructions can be executed by querying only the MMR bits. If the next instruction is an RNHPM instruction as determined at step 514, then steps 516–522 are executed. One embodiment of steps 516–522 is shown in FIG. 7 in which the steps may be executed in a single clock cycle of CLK 178.

At time t0, the RNHPM instruction is provided on IBUS 140 to instruction decoder 128. In response, instruction decoder sends a signal on line 159 (not shown) to timing generator 126 indicating that the instruction is a RNHPM instruction and causing the following signals to be generated by timing generator 126. In response to the RNHPM instruction and at step 516, timing generator 126 will cause MSKVBIT on line 164 to be low such that CL 266 and CLB 268 are driven to high and low states, respectively, and the MMR CAM cells 250 are compared with a logic one. The results of this comparison are reflected on match lines 204. Note that the CAM array cells 104 and/or the validity bits 108 are not compared again with the comparand data during the RNHPM instruction (i.e., they are masked, for example, by a signal sent to comparand register 120 or a mask register); rather, only the MMR CAM cells 250 need to be compared with a logic one to determine which CAM location in CAM array 104 has the next highest priority matching location.

At time t1, match latch 114 latches the match results generated by MMR CAM cells 250 in response to a signal on line 172. The latched match signals are coupled to priority encoder 116. Timing generator 126 then sends a signal on line 174 at time t2 to signal priority encoder 116 to start encoding the latched match line data. Alternatively, no signal on line 174 is required and priority encoder 116 starts to encode the latched match line data immediately. Priority encoder 116 then determines if there is a match, and outputs the match flag signal /MFINT on line 148 and the multiple match signal /MMF on line 150. Priority encoder 116 also determines the highest priority matching address from the match results output by match latch 114. The highest priority matching location of the MMR CAM cells 250 is now the "next" highest priority matching location relative to the initial compare instruction executed in steps 502–512. At time t3, the outputs of priority encoder 116 may be latched into address latch 118 in response to a signal on line 176. The outputs of priority encoder are also provided to bus 146 and output multiplexer 134 and status register 132. For an alternative embodiment, the output of priority encoder 116 is supplied to bus 162 without being latched by address latch 118. The highest priority matching address may then be output to ADS BUS 142 by the end of the clock cycle (e.g., by time t8) at step 518.

The RNHPM operation then enables data stored in one or more of the CAM cells of CAM array 104 (and/or validity bits 108) corresponding to the current highest priority matching location to be output to ADS BUS 142 during the same or later clock cycles at step 520. This may be accomplished by timing generator 126 asserting a signal on line 166 at time t4 causing address selector 110 to provide the highest priority address to address decoder 112. Address decoder 112 may then provide the decoded address to CAM array 104 in response to a signal on line 168 at time t5. Alternatively, a signal on line 168 may not be required. CAM array 104 may then access the highest priority match address in CAM array 104 and selected data may be read out and supplied to output multiplexer 134 and status register 132 via sense amplifiers 122. Sense amplifiers 122 may be enabled at time t7, or their outputs latched by a signal on line 170. The selected data may be stored in one CAM cell, groups of CAM cells, and/or CAM cells that did not participate in the previous search. The highest priority match address on bus 146, the data from CAM array 104 on bus 152, (and/or the validity bits, the MMR bits, and/or other status information) may then be output to ADS BUS 142 via output multiplexer 134 by time t8.

At step 522 and at the end of the RNHPM instruction illustrated in FIG. 7, the highest priority MMR CAM cell 250 is loaded with a logic zero to indicate that it no longer holds the highest priority matching information (as it has already been read out of CAM device 100). This may be accomplished by setting MMR_RESET to a low state on line 165, providing logic zero data on line 171 to write circuit 121, and pulsing MMRWD on line 180 to a high state at time t6. MMR word line control logic 252 for the highest priority MMR CAM cell 250 will cause its associated MMRWL 256 to be asserted and write the logic zero data from BL 262.

As shown in FIG. 7, steps 516–522 may be completed by CAM device 100 in one clock cycle of CLK 178. Alternatively, the RNHPM instruction may be completed over several clock cycles.

The time differences between the signals by timing generator 126 in FIGS. 6 and 7 are sufficient to allow the operations described above to function properly under anticipated, characterized, or specified process, temperature, and supply voltage ranges. For one embodiment, the clock period of CLK 178 (i.e., t9–t0) may be approximately 25 nanosecond (ns) and the sustained maximum search rate may be approximately 40 million searches per second. It will be appreciated that faster or slower clock frequencies and search rates may be implemented by CAM device 100.

The signals generated by timing generator 126 are shown in FIGS. 6 and 7 as pulse signals. For alternative embodiments, a rising or falling edge of a signal may be generated instead of a pulse signal. The pulse signals may also be programmable or adjustable to have any pulse width.

Timing generator 126 may be any timing generator circuit that generates the signals on lines 160, 164, 165, 166, 168, 170, 171, 172, 174, 176, and 180 at the appropriate times. Timing generator 126 may include control logic that generates one or more of these signals in response to one or more clock signal. For one embodiment, the control logic may be a pulse generator circuit. The pulse signals generated by the control logic may be delayed by a series of delay elements to generate the signals on lines 160, 164, 165, 166, 168, 170, 171, 172, 174, 176, and 180. The delay elements may include, for example, resistors, capacitors, transistor pass gates, inverting buffers, and/or non-inverting buffers. Each delay element may also include a programmable element that enables a user or manufacturer to program the delay and/or pulse width of each of the delay elements so that the pulses on lines 160, 164, 165, 166, 168, 170, 171, 172, 174, 176, and 180 may be generated at the appropriate times.

For an alternative embodiment, the control logic or other clock circuitry may generate a plurality of signals at different times, and timing generator 126 may include circuitry that selectively enables each of the clock signals to be coupled to lines 160, 164, 165, 166, 168, 170, 171, 172, 174, 176, and 180 at the appropriate times.

For still another embodiment, CAM device 100 may include clock circuitry that generates a clock signal that has a frequency that is n times the frequency of CLK 178, where n is greater than one. Timing generator 126 may be a state machine or counter that consecutively generates the signals on lines 160, 164, 165, 166, 168, 170, 171, 172, 174, 176, and 180 once per clock cycle of the clock signal generated by the clock circuitry.

For yet another embodiment, timing generator 126 may include a clock generator and latches. The clock generator may generate one or more clock signals in response to CLK 178. The clock signals may be pulse signals or edge transitions, and may be of any pulse width. The clock signals may then be provided to the clock inputs of latches that may be self-timed latches that generate pulse signals on lines 160, 164, 165, 166, 168, 170, 171, 172, 174, 176, and 180 in response to clock signals generated by clock signals output by the clock generator.

It will be appreciated that the signals generated by timing generator 126 may be generated in response to a transition of CLK 178 or another internal clock signal. It will also be appreciated that the signals generated by timing generator 126 may alternatively occur over more than one clock cycle of CLK 178.

Figure 8:
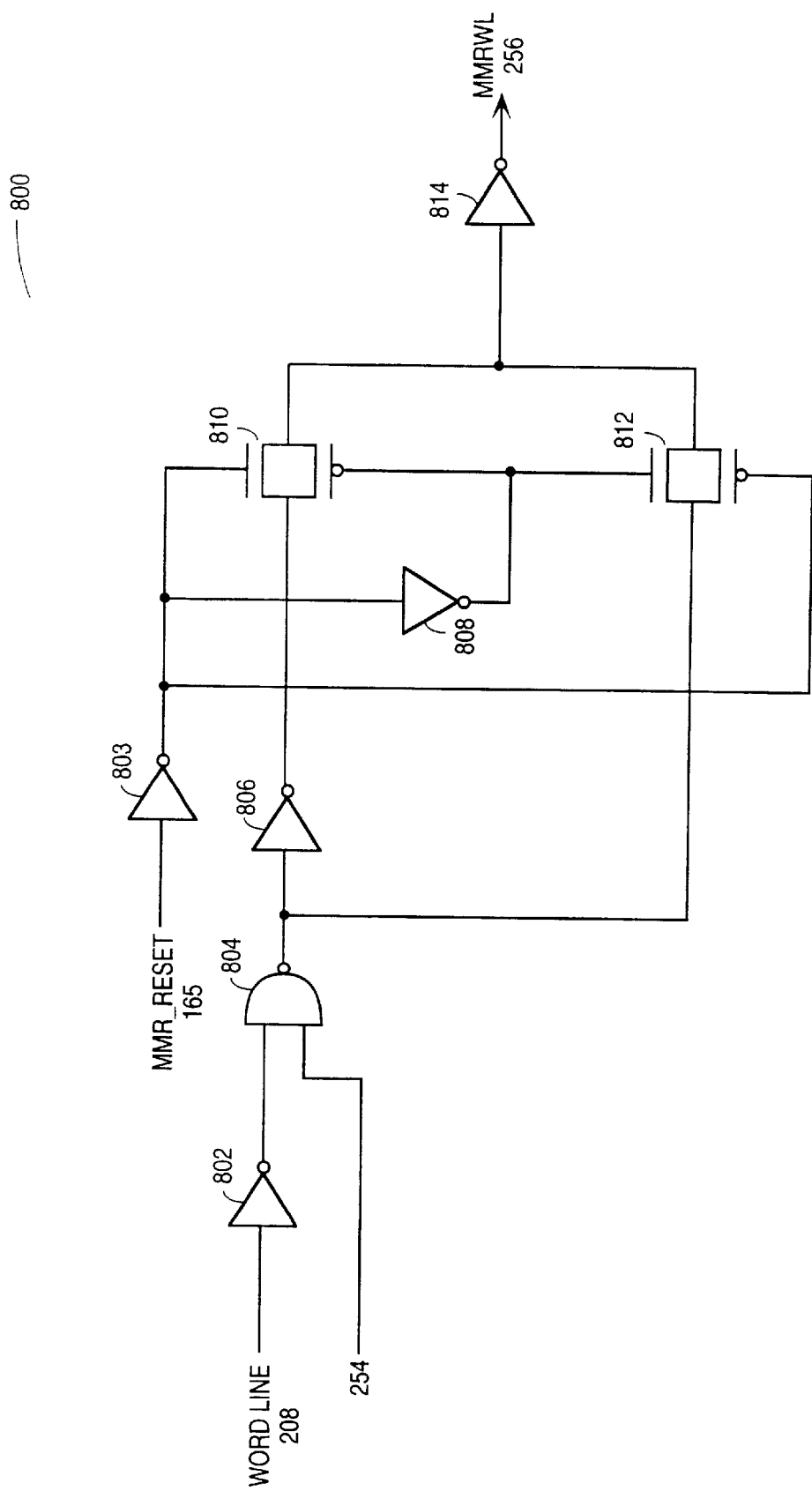
FIG. 8 is one embodiment of MMR word line control logic of FIG. 2.

FIG. 8 shows MMR word line control logic 800 that is of one embodiment of the MMR word line control logic 252 of FIG. 2. MMR word line control logic includes inverter 802, inverter 803, NAND gate 804, inverter 806, inverter 808, transmission or transfer gates 810 and 812, and inverter 814. Other embodiments may be used. NAND gate 804 has a first input coupled the logical complement of word line 208 via inverter 802, a second input coupled to an output 254 of the match latch 114, and an output coupled to an input of transmission gate 812 and the input of inverter 806. Transmission gate 812 has its p-channel gate coupled to the logical complement of MMR_RESET on line 165 via inverter 803, its n-channel gate input coupled to MMR_RESET via inverters 803 and 808, and its output terminal coupled to MMRWL 256 via inverter 814. Transmission gate 810 has its n-channel gate coupled to the logical complement of MMR_RESET via inverter 803, its p-channel gate input coupled to MMR_RESET via inverters 803 and 808, an input terminal coupled to the output of inverter 806, and an output terminal coupled to MMRWL 256 via inverter 814. FIG. 9 is a truth table for the logic of FIG. 8. Other embodiments for MMR word line control logic may be used.

FIG. 11 shows a MMR CAM cell 1100 that is one embodiment of MMR CAM cells 250 of FIG. 2. Other embodiments may be used. MMR CAM cell 1100 includes a comparator 1102 and a RAM cell 1104. Comparator 1102 includes n-channel transistors 1108 and 1110 coupled in series with each other and coupled between match line 204 and VREF line 1132. Transistor 1108 has is gate coupled to CL 266, and transistor 1110 has its gate coupled to line 1116. Comparator 1102 also includes n-channel transistors 1112 and 1114 coupled in series with each other and coupled between match line 204 and VREF 1132. Transistor 1112 has its gate coupled to CLB 268, and transistor 1114 has its gate coupled to line 1118. VREF line 1132 may be ground or another potential. Match line 204 may also be coupled to a power supply voltage VDD via pull-up transistor 1106 such that match line 204 remains in a high state when no match occurs.

RAM cell 1104 includes two cross-coupled CMOS inverters. The first inverter includes p-channel transistor 1120 coupled in series between n-channel transistor 1124 and p-channel transistor 1118. The second inverter includes p-channel transistor 1128 coupled in series between n-channel transistor 1136 and p-channel transistor 1126. The gates of transistors 1120 and 1128 are coupled to the logical complement of MMRWD via inverter 1134. MMRWD 180 will cut off transistors 1120 and 1128 during a write operation to RAM cell 1104. In an alternative embodiment, transistors 1120 and 1128 may be omitted. The input of the first inverter is coupled to line 1116, and the output of the first inverter is coupled to line 1118 and the source (drain) of n-channel transistor 1122. The drain (source) of transistor 1122 is coupled to BL 262, and the gate of transistor 1122 is coupled to MMRWL 256. The input of the second inverter is coupled to line 1118, and the output of the second inverter is coupled to line 1116 and the source (drain) of n-channel transistor 1130. The drain (source) of transistor 1130 is coupled to BLB 264, and the gate of transistor 1130 is coupled to MMRWL 256.

Figure 12:
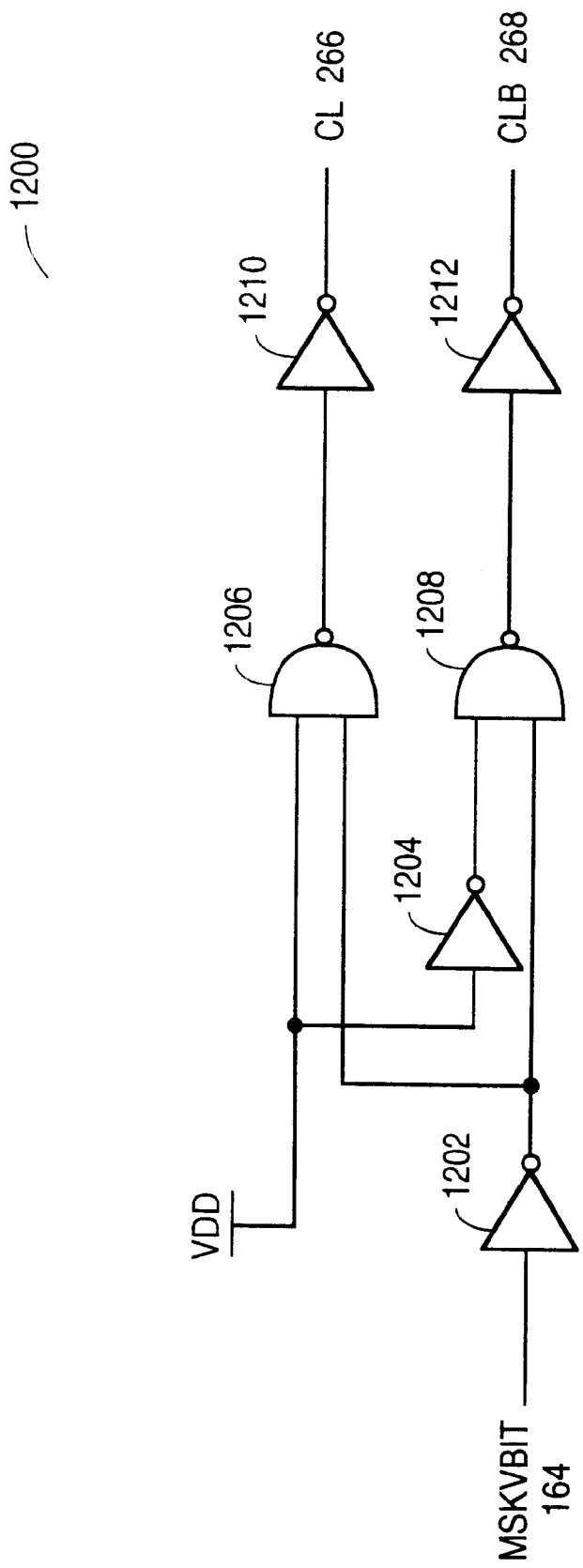
FIG. 12 is a logic diagram of one embodiment of the MMR comparand register of FIG. 2.

FIG. 12 shows MMR comparand register 1200 that is one embodiment of MMR comparand register 258 of FIG. 2. Other embodiments may be used. MMR comparand register 1200 includes NAND gate 1206 that has a first input coupled to a power supply voltage VDD (i.e., a logic one state), a second input coupled to the logical complement of MSKVBIT 164 via inverter 1202, and an output coupled to CL 266 via inverter 1210. MMR comparand register 1200 also includes NAND gate 1208 that has a first input coupled to the logical complement of VDD (i.e., a low state) via inverter 1204, a second input coupled to the logical complement of MSKVBIT 164 via inverter 1202, and an output coupled to CLB 268 via inverter 1212.

Figure 13:
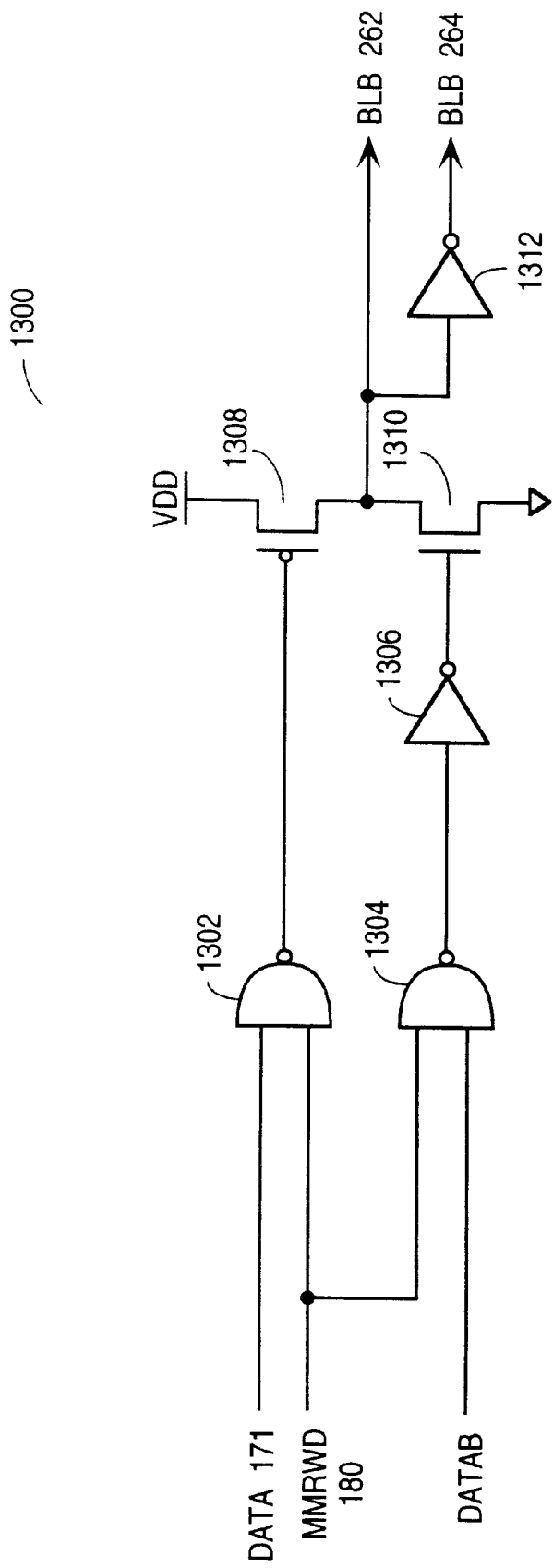
FIG. 13 is a logic diagram of one embodiment of the write circuit of FIG. 1.

FIG. 13 shows write circuit 1300 that is one embodiment of write circuit 121 of FIG. 2. Write circuit 1300 includes NAND gate 1302 that has a first input coupled to DATA 171, a second input coupled to MMRWD 180, and an output coupled to the gate of p-channel transistor 1308. Write circuit 1300 also includes NAND gate 1304 that has a first input coupled to MMRWD 180, a second input coupled to DATAB (the logical complement of DATA 171), and an output coupled to the gate of n-channel transistor 1310 via inverter 1306. Transistors 1308 and 1310 are coupled is series between power and ground, and have their drain terminals coupled to BL 262 and to BLB 264 (via inverter 1312). For an alternative embodiment write circuit 1300 may be used to drive BL 262 and another write circuit may be used to drive BLB 264. The other circuit used to drive BLB 264 may similar to circuit 1300 except with the first input of NAND gate 1302 receiving DATAB, the second input of NAND gate 1304 receiving DATA, and BLB 262 connected to the drains of transistors 1308 and 1310 (without inverter 1312).

Figure 10:
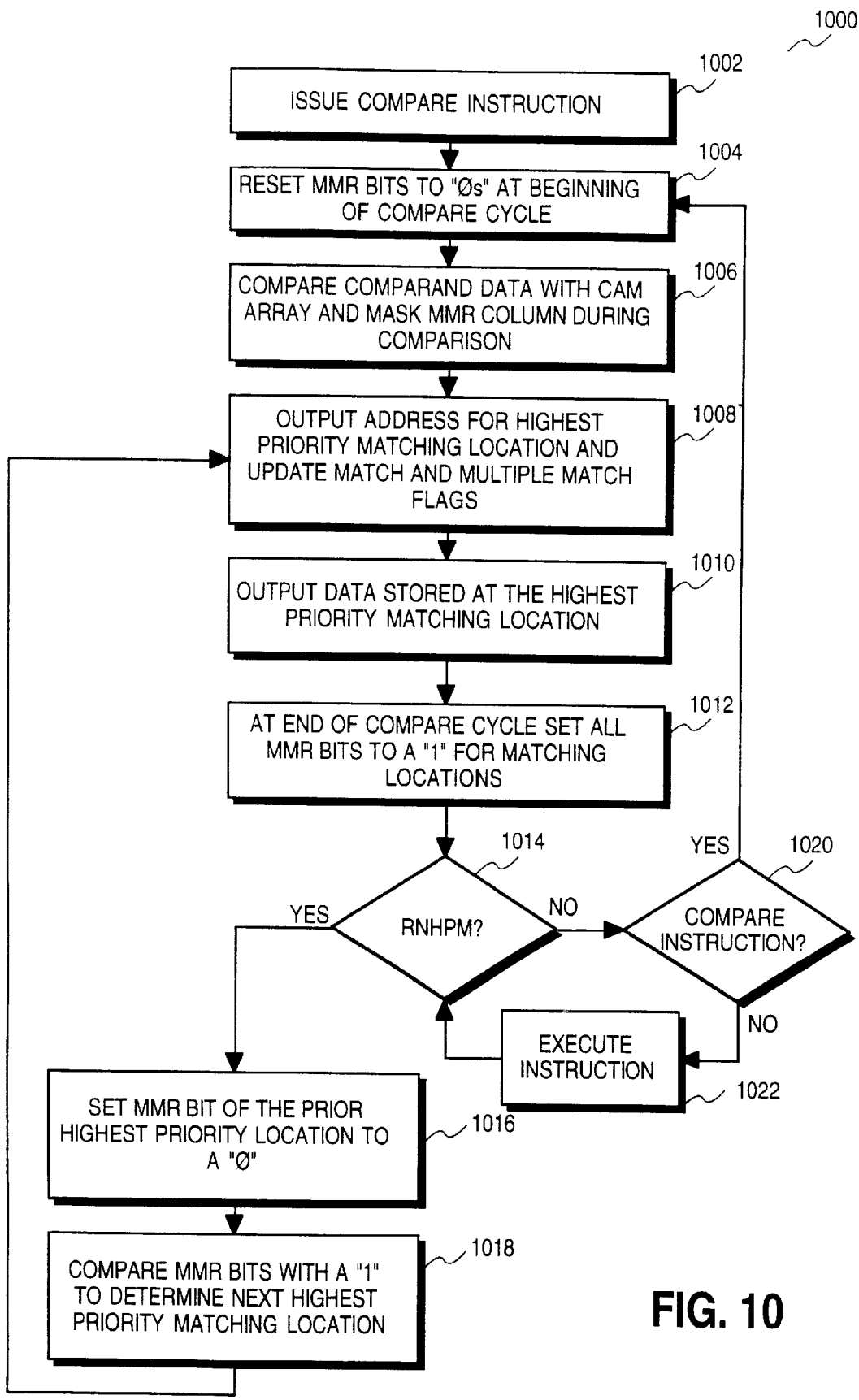
FIG. 10 is another embodiment of a method of performing compare and RNHPM instructions.

FIG. 10 shows another embodiment 1000 of the process illustrated in FIG. 4 in which CAM 100 can implement compare and RNHPM instructions. Process 1000 is similar to that of process 500 of FIG. 5 except for the following: (1) the highest priority matching location is not set to a logic zero state by the end of the initial compare instruction; and (2) when an RNHPM instruction is decoded, the highest priority matching location from a previous compare or RNHPM instruction is first set to a logic zero state prior to a comparison of the MMR bits with a logic one state.

At step 1002, instruction decoder 128 receives and decodes the compare instruction on IBUS 140 in response to the start of a clock cycle of CLK 178. In response to the compare instruction, instruction decoder 128 may send one or more signals on bus 159 indicating that a compare instruction has been received by CAM device 100. In response, timing generator 126 may send a signal on line 160 such that comparand data on CBUS 138 is loaded into comparand register 120. As previously described, the comparand data may alternatively not be loaded into comparand register 120, but may be directly compared with CAM array 104 from CBUS 138.

The compare instruction also causes CAM device 100, at step 1004, to reset the MMR bits to a logic zero at the beginning of the compare cycle. As described above, this may be accomplished by setting MMR_RESET on line 165 to a high state, providing a logic zero as data on line 171 to write circuit 121, and pulsing (or setting) the MMRWD signal on line 180 to a high state.

At step 1006, the comparand data is then compared against one or more CAM cells in CAM array 104 while the MMR bits are masked so as not to affect the comparison. Masking of the MMR bits can be accomplished by timing generator 126 driving MSKVBIT to a high state on line 164 during the comparison operation. In response to the high state on line 164, MMR comparand register 258 will drive CL 266 and CLB 268 to appropriate states to mask the MMR CAM cells 250 from the comparison (e.g., both CL and CLB low).

The match results on match lines 113 are latched by match latch 114. The latched match signals are coupled to priority encoder 116 which determines if there is a match and outputs match flag signal /MFINT on line 148 and a multiple match signal /MMF on line 150. Priority encoder 116 also determines the highest priority matching address from the match results output by match latch 114. The outputs of priority encoder 116 are also provided to bus 146, output multiplexer 134, and status register 132. For an alternative embodiment, the output of priority encoder 116 is supplied to bus 162 without being latched by address latch 118. At step 1008, the highest priority matching address may then be output to ADS BUS 142 before the end of the clock cycle of the compare instruction. At step 1010, the compare operation then enables data stored in one or more of the CAM cells of CAM array 104 corresponding to the highest priority matching location to be output to ADS BUS 142 during the same or later clock cycles (e.g., as described with respect to step 512 of FIG. 5).

At step 1012 and by the end of the compare instruction, all of the MMR CAM cells 250 corresponding to matching locations in CAM array 104 are loaded with a logic one in response to MMR_RESET, logic one data provided on line 171 to write circuit 121, and pulsing MMRWD on line 180 to a high state. The logic shown in FIG. 8 may be altered accordingly to implement step 1012.

Steps 1002–1012 may be completed by CAM device 100 in one clock cycle of CLK 178. Alternatively, the compare instruction may be completed over several clock cycles.

A subsequent instruction may now be performed by CAM device 100. If the subsequent instruction is not an RNHPM instruction as determined at step 1014, then CAM device 100 determines if the next instruction is a compare instruction at step 1020. If the next instruction is a compare instruction, then the process returns to step 1004. If, however, the next instruction is neither a RNHPM instruction or a compare instruction, then the instruction is executed without generally affecting the MMR bits such that subsequently received RNHPM instructions can be executed by querying only the MMR bits. If the next instruction is an RNHPM, then process 1000 transitions to step 1016 in which an RNHPM instruction is provided on IBUS 140 to instruction decoder 128. In response, instruction decoder sends a signal on line 159 to timing generator 126 indicating that the instruction is a RNHPM instruction. In response to the RNHPM instruction, MMR word line control logic 252 sets the highest priority MMR CAM cell 250 from the previous compare instruction to a logic zero state. At step 1018, CAM device 100 then compare the MMR bits in the MMR CAM cells 250 with a logic one to determine the next highest priority matching location. Note that the CAM array cells 104 and/or the validity bits 108 are not compared again with the comparand data during the RNHPM instruction (i.e., they are masked, for example, by a signal sent to comparand register 120 or a mask register); rather, only the MMR CAM cells 250 need to be compared with a logic one to determine which CAM location in CAM array 104 has the next highest priority matching location. The process then repeats steps 1008–1012 to complete the RNHPM instruction and output the next highest priority matching address, data stored in one or more CAM cells at the matching addresses, and/or status information to ADS BUS 142.

Steps 1014–1018 and 1008–1012 may be completed for subsequent RNHPM instructions until no further matches exist in CAM device 100. Steps 1014–1018 and 1008–1012 may be completed by CAM device 100 in one clock cycle of CLK 178. Alternatively, the RNHPM instruction may be completed over several clock cycles.

CAM device 100 may also be included in a CAM system that has multiple CAM devices connected in a depth cascade configuration. Depth cascading of CAM devices effectively results in generating a CAM device that has a larger number of memory locations.

Figure 14:
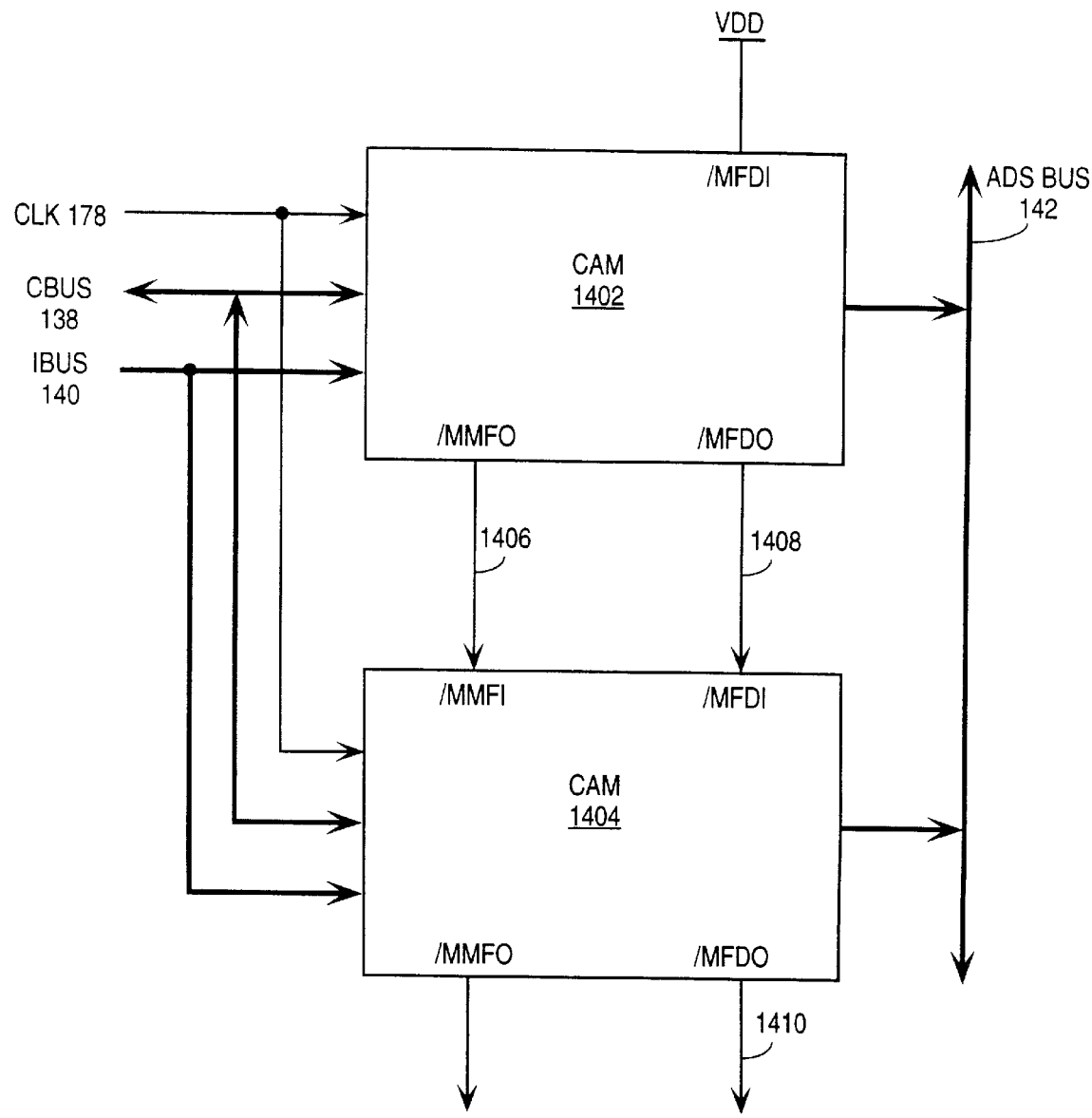
FIG. 14 is a block diagram of one embodiment of depth cascading CAM devices into a CAM system that can implement RNHPM instructions.

FIG. 14 shows a CAM system 1400 that includes two CAM devices 1402 and 1404 interconnected in a depth cascade configuration. Any number of CAMs may be depth cascaded as shown in FIG. 14. The total memory size of system 1400 may be larger than the individual sizes of each of CAMs 1402 and 1404. For example, if each CAM device is a 4k×64 CAM device, then system 1400 may operate as a 8k×64 CAM device. Any size of CAM devices may be used in the present invention. Also, CAMs of different widths may be cascaded together. Additionally, system 1400 may be formed from stand-alone CAM devices, or may be formed from integrated circuits on a common substrate.

Each CAM device receives in parallel clock signal CLK 178, comparand data from CBUS 138, and instructions from IBUS 140. For alternative embodiments, CBUS 138 and IBUS 140 may be the same bus. Other input signals may also be simultaneously provided to each of CAMs 1402 and 1404 including word enable signals, reset signals, chip enable signals, and the like. CAMs 1402 and 1404 may also output data to ADS BUS 142. Each CAM device 1402 and 1404 may-include the circuitry shown in FIG. 1 and/or FIG. 2 such that each CAM device may perform the RNHPM instruction in one or more clock cycles.

In order for CAM devices 1402 and 1404 to determine which device should send address, data, and/or status information to ADS BUS 142 in response to a RNHPM instruction that is simultaneously supplied to both devices, CAM devices 1402 and 1404 each include a match flag down input pin /MFDI, a match flag down output pin /MPDO, a multiple match flag output pin /MMFO, and a multiple match flag input pin /MMFI. Each CAM device generally has its /MFDO output pin coupled to the /MFDI pin of the next device, and its /MMFO output pin coupled to the /MMFI pin of the next device. The term "next device" refers to the CAM device that has the next lower priority addresses relative to the current device. For example, CAM 1404 may be the "next device" for CAM 1402.

CAM 1402 may be designated as the highest priority CAM device by coupling its /MFDI input pin to a power supply VDD. The highest priority CAM device 1402 may have the lowest physical addresses of, for example, zero to X, and CAM 1404 may have addresses X+1 to N where system 1400 has a total of N CAM words available for storage. For alternative embodiments, CAM 1402 may have the lowest priority addresses, and CAM 1404 may have the highest priority addresses.

In general, an initial compare instruction is simultaneously provided to each of CAMs 1402 and 1404 in system 1400, and each CAM device compares the comparand data with the data stored in its CAM array. Assuming that both CAMs have one or more matching locations, then CAM 1402 will initially output data to ADS BUS 142 as CAM device 1402 is the highest priority device. When a subsequent RNHPM instruction is issued to both CAMs, then if CAM device 1402 still has a matching location, then CAM 1402 uses its MMR bits to locate the next highest priority matching location in CAM 1402 (and system 1400) and outputs the matching address, data, and/or status information for the next highest priority matching location to ADS BUS 142. CAM 1404 monitors its /MMFI and /MFDI inputs on lines 1406, respectively, to determine when it will be inhibited from taking control of the ADS BUS 142. When /MMFI transitions to a high state and /MFDI is in a low state in response to the RNHPM (or initial compare) instruction, then CAM 1404 knows that CAM 1402 is currently outputting data to ADS BUS 142 from the last matching location left in CAM 1402. Thus, CAM 1404 will know that when a subsequent RNHPM instruction is received from IBUS 140, then CAM 1404 can take control of ADS BUS 142.

Figure 15:
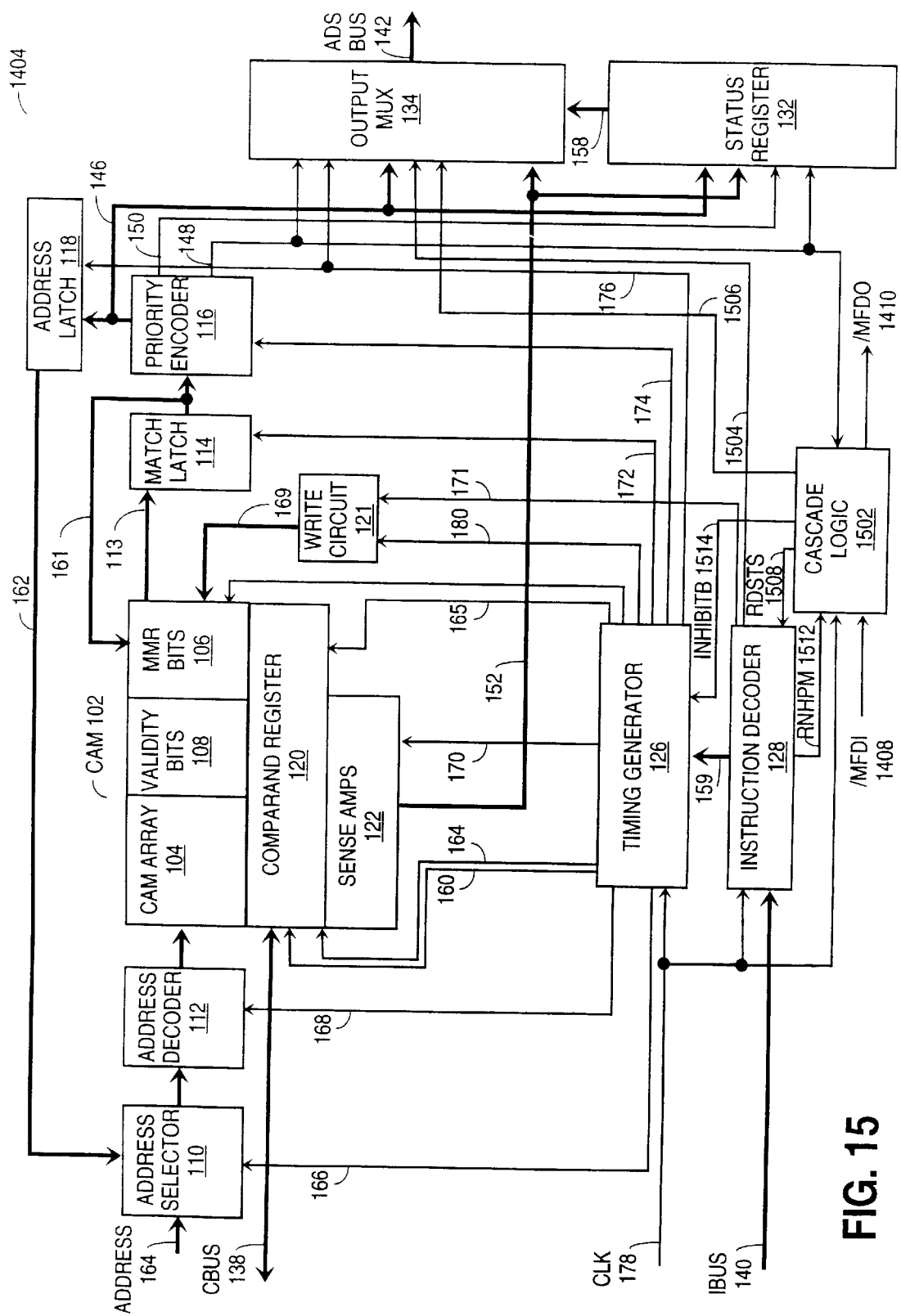
FIG. 15 is a block diagram of one embodiment of a CAM device including cascade logic.

FIG. 15 is one embodiment of CAM device 1404 (and CAM 1402). CAM 1404 is CAM device 100 that includes cascade logic 1502. Cascade logic 1502 enables CAM devices 1402 and 1404 to know which CAM device may take control of the ADS BUS 142 in response to an RNHPM instruction. Cascade logic 1502 receives /MFDI 1408, /MFINT 148, /MFDO 1410, and RNHPM 1512 from instruction decoder 128. RNHPM 1512 is a signal that indicates when a RNHPM instruction has been received by CAM 1404. Cascade logic 1502 also generates RDSTS 1508 and INHIBITB 1514. RDSTS 1508 is a signal that indicates when CAM 1404 should read the next highest priority matching address from status register 132 rather than directly from, for example, priority encoder 116. INHIBITB 1514 is a signal that inhibits a comparison of the MMR bits 106 with a logic one: (1) the first time that the RNHPM instruction is executed by CAM 1404 (and not executed in CAM 1402), and (2) in those CAM devices not having the highest priority matching location. RDSTS 1508 and INHIBITB 1514 will be described in more detail below.

Figure 16:
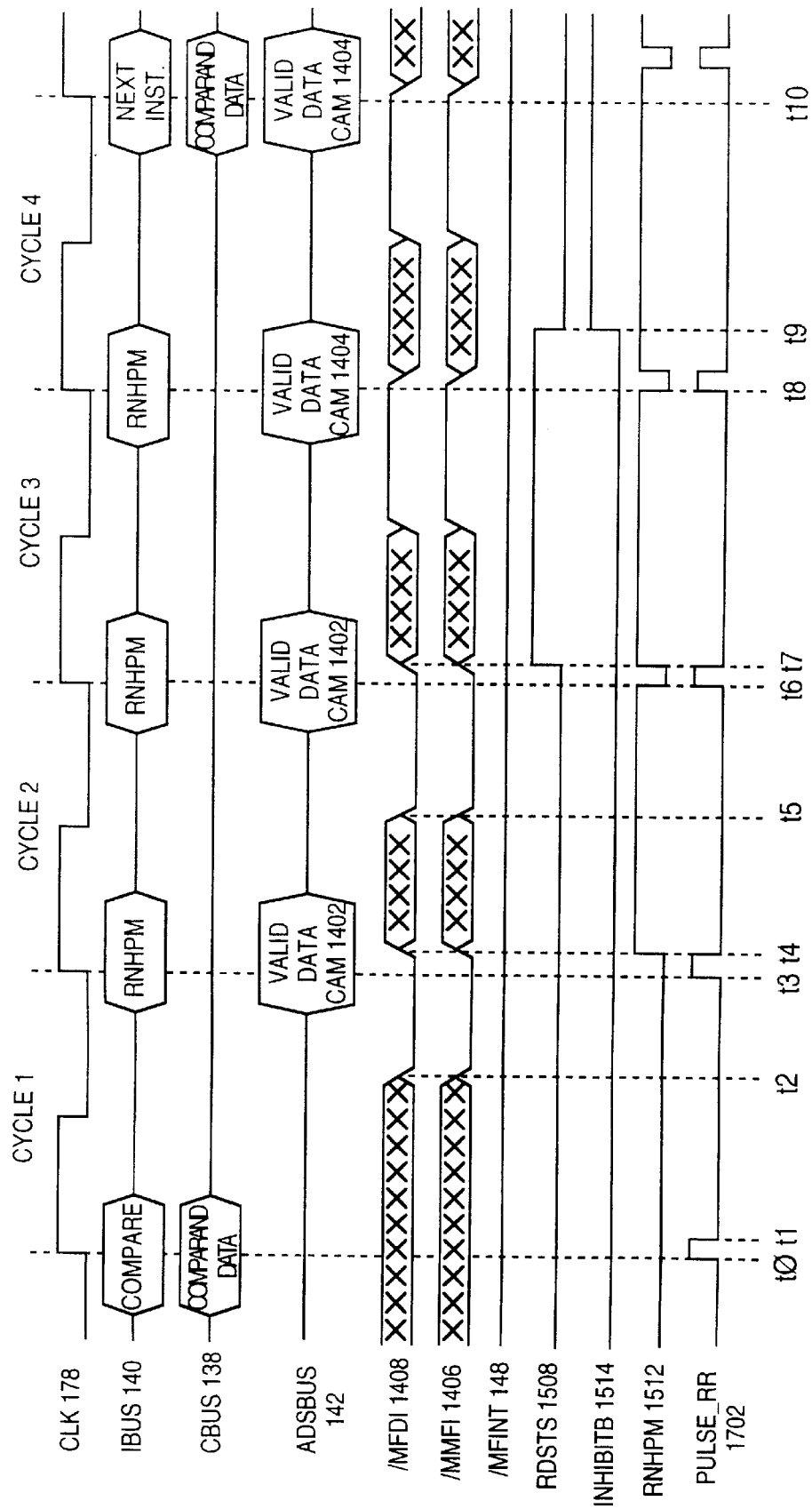
FIG. 16 is a timing diagram of one embodiment of the operation of one of the CAM devices of FIG. 14.

FIG. 16 illustrates one embodiment of the operation of CAM 1404 illustrated in FIGS. 14 and 15. Each of CAMs 1402 and 1404 may implement the flow charts shown in FIGS. 4 and 5 (or FIG. 10) with changes noted below. In this example, a compare operation is issued to both CAMs at time t0 and each CAM device 1402 and 1404 determines that it has two matching locations. As CAM 1402 has the higher priority matching locations, it will take control of ADS BUS 142 and output its matching address to ADS BUS 142 before the end of the cycle 1. Each CAM will, however, update its MMR bits to reflect which CAM array locations have matching locations. Additionally, as described with respect to FIG. 5 above, at the end of the compare cycle the MMR bits of highest priority matching location in each of CAMs 1402 and 1404 will be set to a logic zero while the other MMR bits corresponding to the other matching locations will be set to a logic one. CAM 1402 will also drive the /MFDI and /MMFI input pins of CAM 1404 to a low state at time t2 indicating that CAM 1402 has more than one matching location. Even though CAM 1404 has two matching locations (/MFINT 148 low), CAM 1404 will not take control of ADS BUS 142 since /MFDI 1408 is low. Cascade logic 1502 may send a signal on line 1506 that disables output multiplexer 134 from providing data to ADS BUS 142.

CAMs 1402 and 1404 then receive a RNHPM instruction at time t3 in cycle 2. This will cause RNHPM 1512 to be asserted to a high state at time t4; however, since /MMFI 1406 was low in the previous cycle, CAM 1404 knows that CAM 1402 has at least one more matching location. Thus, cascade logic 1502 will assert INHIBITB 1514 to a low state which will inhibit timing generator 126 from providing signals to the various circuit blocks (e.g., signals shown in FIGS. 6 and 7) such that CAM 1404 does not perform an RNHPM instruction. At time t5, CAM 1402 will drive /MFDI of CAM 1404 to a low state indicating that it has a match, and will also drive /MMFI 1406 to a high state indicating that CAM 1402 does not have any more multiple matches. After this cycle, CAM 1404 will have no more matching locations. When CAM 1404 detects that /MFDI 1408 is low and /MMFI 1406 is high, then cascade logic 1502 of CAM 1404 knows that the next RNHPM instruction can be executed by CAM 1404 as CAM 1402 will not have any further matching locations.

When CAMs 1402 and 1404 receive the next RNHPM instruction in cycle 3 at time t6, CAM 1402 has no further matching locations and CAM 1404 can execute the RNHPM instruction. Recall that as a result of the process illustrated in FIG. 5, when an initial compare instruction is received by each CAM device in cycle 1, the MMR bits of the highest priority matching location in each CAM device have already been set to a logic zero. Thus, when CAM 1404 is able to respond to the RNHPM instruction of cycle 3 it will not determine its correct highest priority matching location if it compares the MMR bits with a logic one. However, the matching location of the highest priority matching location may be stored in status register 132 during the initial compare instruction of cycle 1 such that it can now be accessed in cycle 3 and output to ADS BUS 142. To accomplish this, cascade logic 1502 asserts RDSTS 1508 to a high state in cycle 3 the first time that CAM 1404 is able to take control of ADS BUS 142 in response to a RNHPM instruction. RDSTS 1508 may be provided to instruction decoder 128 which may then send a signal on line 1504 that causes output multiplexer 134 to output the matching address information from status register 132 to ADS BUS 142 by time t8. Alternatively, RDSTS 1508 may be provided directly to output multiplexer 134 to select status register 132. Data from one or more of the CAM cells stored in CAM array 104 associated with the highest priority matching location in CAM 1404 and/or status information may also be stored in status register 132 and be output to ADS BUS 142 by time t8. Also note that during the first RNHPM instruction executed by CAM 1404 that cascade logic 1502 continues to assert INHIBITB 1514 to a low state such that the MMR bits are not updated. This will enable subsequent RNHPM instructions to correctly access the next highest priority matching location by comparing the MMR bits to a logic one.

CAMs 1402 and 1404 then receive the next RNHPM instruction in cycle 4 at time t8. CAM 1404 compares MMR bits with a logic one and outputs the matching address of the next highest priority matching address to ADS BUS 142 by time t10. The MMR bit corresponding to the next highest priority matching address output by time t10 will then be updated to a logic zero state by time t10 as cascade logic 1502 will assert INHIBITB 1512 to a high state during this RNHPM instruction of cycle 4.

Figure 17:
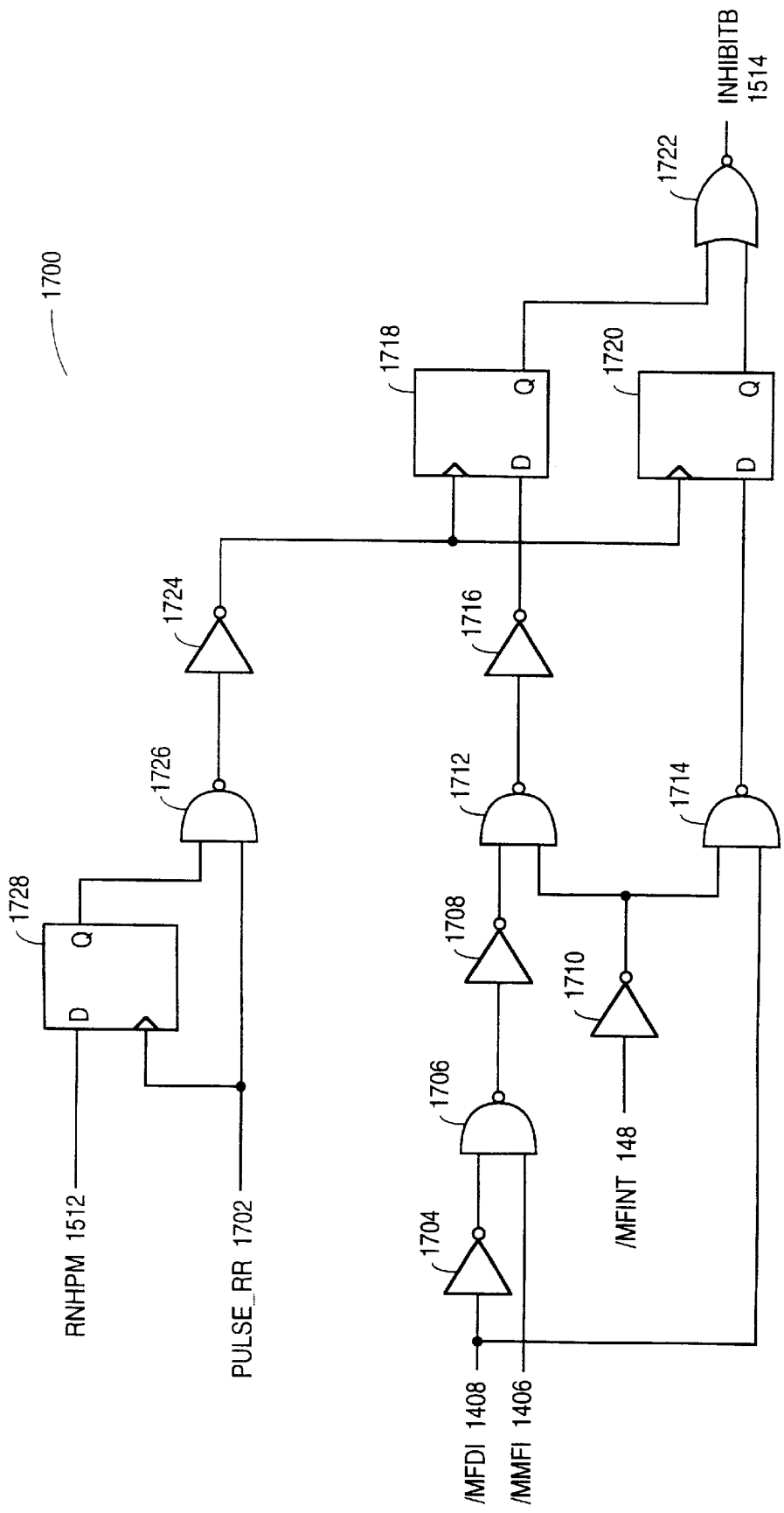
FIG. 17 is a logic diagram of one embodiment of the cascade logic of FIG. 15.

FIG. 17 is a block diagram of cascade logic 1700 that is one embodiment of cascade logic 1502 of FIG. 15. Cascade logic 1700 generates the signals shown in FIG. 16 when cascade logic 1700 is included in CAM 1404. Other embodiments may be used.

Cascade logic 1700 includes NAND gates 1706, 1712, 1714, and 1726, NOR gate 1722, latches 1728, 1718, and 1720, and inverters 1704, 1708, 1710, 1716, and 1724. NAND gate 1706 has a first input coupled to the logical complement of /MFDI 1408 via inverter 1704, a second input coupled to /MMFI 1406, and an output coupled to a first input of NAND gate 1712 via inverter 1708. NAND gate 1712 has a second input coupled to the logical complement of /MFINT 148 via inverter 1710, and an output coupled to the D input of latch 1718 via inverter 1716. NAND gate 1714 has a first input coupled to the logical complement of /MFINT 148 via inverter 1710, a second input coupled to the /MFDI 108, and an output coupled to the D input of latch 1720. NOR gate 1722 has a first input coupled to the Q output of latch 1718, a second input coupled to the Q output of latch 1720, and an output coupled to INHIBITB 1514. Latches 1718 and 1720 are clocked by NAND gate 1726 via inverter 1724. NAND gate 1726 has a first input coupled to the Q output of latch 1728, and a second input coupled to PULSE_RR 1702. PULSE_RR 1702 is a pulse signal that may be generated by a clock buffer or one-shot circuit in response to CLK 178. Latch 1728 receives RNHPM 1512 at its D input, and is clocked by PULSE_RR 1702.

Figure 18:
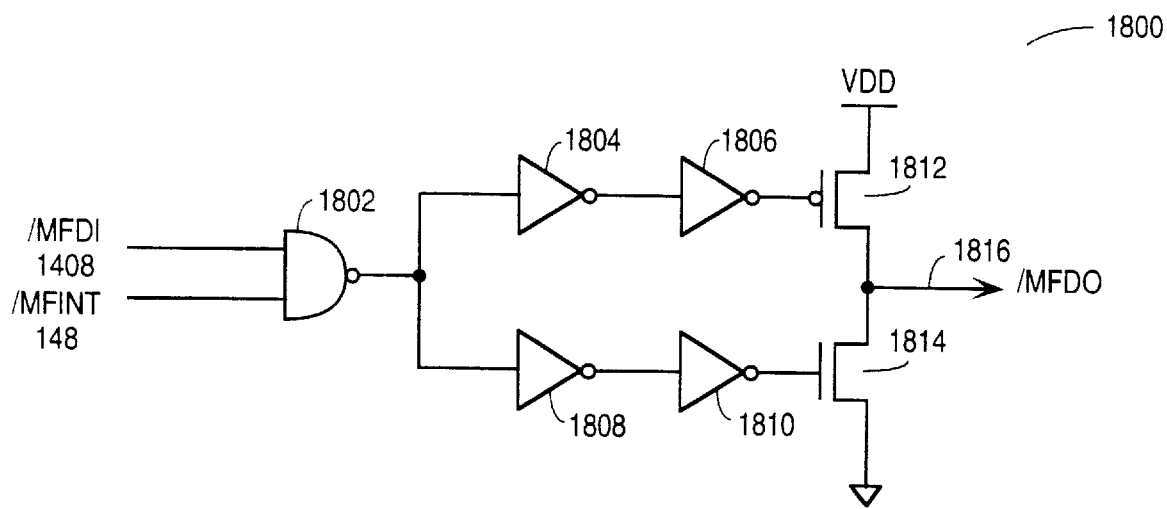
FIG. 18 is a logic diagram of one embodiment of the match flag down output logic used to generate/MFDO.

FIG. 18 shows one embodiment of match flag down output logic 1800 that may be included within CAM 1500 (e.g., within cascade logic 1502) to generate /MFDO. Other embodiments may be used.

Match flag logic 1800 may include NAND gate 1802, inverters 1804, 1806, 1808, and 1810, PMOS transistor 1812, and NMOS transistor 1814. For an alternative embodiment, inverters 1804, 1806, 1808, and 1810 may be omitted. NAND gate 1802 has its first input coupled to /MFDI on line 1408, and its second input coupled to /MFINT on line 148. The output of NAND gate 1802 is coupled to the gate of PMOS transistor 1812 via the series connected inverters 1804 and 1806. The output of NAND gate 1802 is also coupled to the gate of NMOS transistor 1814 via series connected inverters 1808 and 1810. PMOS transistor 1812 further has its source coupled to VDD and its drain coupled to /MFDO on line 1816. NMOS transistor 1814 further has its drain coupled to line 1816 and its source coupled to ground or approximately zero volts. /MFDO will only be deasserted to a high state if neither /MFDI or /MFINT is asserted to a low state.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of determining the next highest priority matching location in a content addressable memory (CAM) device, comprising:

comparing comparand data with data stored in a plurality of rows of first CAM cells to determine match results;

determining the highest priority row of CAM cells that stores data matching the comparand data;

updating data stored in a plurality of second CAM cells in response to the match results, each of the second CAM cells associated with one of the corresponding rows of CAM cells; and comparing the data stored in only the second CAM cells with a predetermined logic state to determine the next highest priority row of CAM cells that stores data matching the comparand data.

2. The method of claim 1, wherein the comparing the comparand data, updating, and determining occur in response to a first instruction supplied to the CAM device.

3. The method of claim 2, wherein the first instruction is completed in a single clock cycle.

4. The method of claim 2, wherein the comparing the data stored in only the second CAM cells occurs in response to a second instruction supplied to the CAM device.

5. The method of claim 4, wherein the second instruction is completed in a single clock cycle.

6. The method of claim 1, wherein the updating comprises:

writing a first logic state to the second CAM cell associated with the highest priority row of CAM cells that stores data that matches the comparand data, wherein the first logic state is indicative of a mismatch state; and writing a second logic state to the second CAM cells associated with lower priority rows of CAM cells that store data that match the comparand data, wherein the second logic state is indicative of a match state.

7. The method of claim 6, wherein the comparing comprises comparing the data stored in the second CAM cells with the second logic state to determine the next highest priority row of CAM cells that stores data that matches the comparand data.

8. The method of claim 7, further comprising writing the first logic state to the second CAM cell associated with the next highest priority row of CAM cells that stores data that matches the comparand data.

9. The method of claim 1, wherein the updating comprises:

writing a first logic state to the second CAM cells associated with the rows of CAM cells that each store data that matches the comparand data; and subsequently writing a second logic state to the second CAM cell associated with the highest priority row of CAM cells that stores data that matches the comparand data.

10. The method of claim 1, wherein the determining comprises determining the address of the highest priority row of CAM cells that stores data that matches the comparand data.

11. The method of claim 10, further comprising:

decoding the address of the highest priority row of CAM cells that stores data that matches to the comparand data; and selecting the second CAM cell associated with the highest priority row of CAM cells that stores data that matches the comparand data.

12. A content addressable memory (CAM) device comprising:

a CAM array having a plurality of rows each having (1) a plurality of first CAM cells coupled to a match line and a first word line, a (2) a second CAM cell coupled to the match line and a second word line, the second CAM cell for storing match results between comparand data and data stored in the first CAM cells, and (3) control logic coupled to the first word line, the match line, and the second word line, the control logic to control access to the second CAM cell;

a write circuit coupled to each of the second CAM cells, the write circuit to provide data to be written into each of the second CAM cells;

an encoder coupled to the match lines; and a decoder coupled to the encoder and the first word lines.

13. The CAM device of claim 12, further comprising a comparand storage element coupled to the plurality of rows of CAM cells, the comparand storage element for storing comparand data to be compared with data stored in the plurality of rows.

14. The CAM device of claim 12, further comprising a storage element coupled between the match lines and the control logic.

15. The CAM device of claim 12, further comprising an instruction decoder coupled to the write circuit.

16. The CAM device of claim 15, further comprising cascade logic coupled to the instruction decoder, the cascade logic configured to inhibit evaluation of data stored in the second CAM cells in response to a match flag input signal and a multiple match flag input signal to the CAM device.

17. The CAM device of claim 13, further comprising:

an instruction decoder coupled to the write circuit; and a timing generator coupled to the instruction decoder and the comparand storage element.

18. The CAM device of claim 12, wherein the control logic comprises:

a first logic circuit having a first input coupled to receive the first word line, a second input coupled to receive the match lines, and an output; and a second logic circuit having a first input coupled to receive a control signal, a second input coupled to the output of the first logic circuit, and an output coupled to the second word line.

19. A content addressable memory (CAM) device, comprising:
   means for comparing comparand data with data stored in a plurality of rows of first CAM cells to determine match results for each row;
   means for determining the highest priority row of CAM cells that stores data that matches the comparand data;
   means for updating data stored in a plurality of second CAM cells in response to the match results, each of the second CAM cells associated with a corresponding one of the rows of first CAM cells; and
   means for comparing the data stored in the second CAM cells with a predetermined logic state to determine the next highest priority row of CAM cells that stores data that matches the comparand data.

20. The CAM device of claim 19, wherein the means for updating comprises:
   means for writing a first logic state the second CAM cell associated with the highest priority row of CAM cells that stores data that matches the comparand data, the first logic state indicative of a mismatch state; and
   means for writing a second logic state the second CAM cells associated with lower priority rows of CAM that store data that match the comparand data, the second logic state indicative of a match state.

21. The CAM device of claim 20, wherein the means for comparing the data stored in the second CAM cells comprises means for comparing the data stored in the second CAM cells with the second logic state to determine the next highest priority row of CAM cells that stores data that matches the comparand data.

22. The CAM device of claim 21, further comprising means for writing the first logic state to the second CAM cell associated with the next highest priority row of CAM cells that stores data that matches the comparand data.

23. The CAM device of claim 19, wherein the means for updating comprises means for writing a first logic state to the second CAM cells associated with the rows of CAM cells that each store data that matches the comparand data, and subsequently writing a second logic state to the second CAM cell associated with the highest priority row of CAM cells that stores data that matches the comparand data.

24. The CAM device of claim 23, wherein the means for determining comprises means for determining the address of the highest priority row of CAM cells that stores data that matches the comparand data.

25. The CAM device of claim 24, further comprising:
   means for decoding the address of the highest priority row of CAM cells that stores data that matches the comparand data; and
   means for selecting the second CAM cell associated with the highest priority row of CAM cells that stores data that matches the comparand data.

26. A depth cascaded content addressable memory (CAM) system comprising:
   a first CAM device having a match flag output to provide a match flag output signal; and
   a second CAM device comprising:
      a match flag input coupled to the match flag output of the first CAM device;
      a CAM array having a plurality of rows each having (1) a plurality of first CAM cells coupled to a match line and a first word line, (2) a second CAM cell coupled to the match line and a second word line, the second CAM cell for storing match results between comparand data and data stored in the first CAM cells, and (3) control logic coupled to the first word line, the match line, and the second word line, the control logic to control access to the second CAM cell;
      a comparand storage element coupled to the CAM array;
      a write circuit coupled to each of the second CAM cells;
      an instruction decoder coupled to the write circuit;
      a timing generator coupled to the instruction decoder and comparand storage element; and
      cascade logic coupled to the instruction decoder and the timing generator, the cascade logic operative to inhibit evaluation of data stored in each of the second CAM cells in response to the match flag input signal.

27. The CAM system of claim 26, wherein the first CAM device further having a multiple match flag output, and the second CAM device further having a multiple match flag input coupled to the multiple match flag output of the first CAM device.

28. A method of operating a depth cascaded content addressable memory (CAM) system having at least a first and second CAM device each having a CAM array, comprising:
   determining that each CAM array has at least one row of CAM cells that stores data that matches comparand data;
   updating data stored in a plurality of second CAM cells in each CAM device in response to the match results, each of the second CAM cells associated with a corresponding row of CAM cells;
   asserting a match flag signal to a first state from the first CAM device to the second CAM device to indicate a match in the first CAM device;
   inhibiting comparison of the data stored in the second CAM cells in the second CAM device with a predetermined logic state in response to the asserted match flag signal; and
   outputting from the first CAM device an address of the highest priority row of CAM cells that stores data that matches the comparand data.

29. The method of claim 28, further comprising:
   providing an instruction to both CAM devices to determine the next highest priority row of CAM cells of the CAM system that stores data that matches the comparand data;
   determining that the first CAM device has the next highest priority row of CAM cells;
   comparing the data stored in the second CAM cells of the first CAM device to determine the address of next highest priority row of CAM cells; and
   outputting an address of the next highest priority row of CAM cells from the first CAM device.

30. The method of claim 28, further comprising:
   providing an instruction to both CAM devices to determine the next highest priority row of CAM cells of the CAM system that stores data that matches the comparand data;
   deasserting the match flag signal to a second state from the first CAM device to the second CAM device to indicate a mismatch in the first CAM device;
   comparing the data stored in the second CAM cells of the second CAM device to determine the address of next highest priority row of CAM cells; and outputting an address of the next highest priority row of CAM cells from the second CAM device.

31. The method of claim 30, further comprising:

providing another instruction to both CAM devices to determine another row of CAM cells of the CAM system that stores data that matches the comparand data;

comparing the data stored in the second CAM cells of the second CAM device to determine the address of the another row of CAM cells; and outputting an address of the another row of CAM cells from the second CAM device.

32. The CAM system of claim 27, wherein the second CAM device further comprises:

an encoder coupled to the match lines and operative to generate an encoded match address; and a decoder coupled to the encoder and the first word lines.

33. The CAM system of claim 32, wherein the second CAM device further comprises a status register coupled to the priority encoder to receive the encoded match address.

34. The CAM system of claim 33, wherein the cascade logic is operative to generate a control signal that indicates that the encoded match address is output from the second CAM device from the status register rather than from the priority encoder.

35. The CAM system of claim 34, wherein the first CAM device comprises:

a CAM array having a plurality of rows each having (1) a plurality of first CAM cells coupled to a match line a first word line, (2) a second CAM cell coupled to the match line and a second word line, the second CAM cell for storing match results between comparand data and data stored in the first CAM cells, and (3) control logic coupled to the first word line, the match line, and the second word line, the control logic to control access to the second CAM cell;

a comparand storage element coupled to the CAM array;

a write circuit coupled to the second CAM cells;

an instruction decoder coupled to the write circuit;

a timing generator coupled to the instruction decoder and comparand storage element; and cascade logic coupled to the instruction decoder, the timing generator, and the match flag output.

36. A method of determining the next highest priority matching location in a content addressable memory (CAM) device, comprising:

determining that a plurality of rows of first CAM cells store data that matches comparand data, wherein each row of the first CAM cells has a corresponding second CAM cell for storing the match results for the row; and simultaneously writing (i) a mismatch result to the second CAM cell associated with the highest priority row of CAM cells that stores data that matches the comparand data, and (ii) a match result to each of the second CAM cells associated with the lower priority rows of the first CAM cells that store data that matches the comparand data.

37. The method of claim 36, wherein the determining writing are executed in a single clock cycle.

* * * * *